(12) United States Patent
Sugiyama et al.

(10) Patent No.: US 8,611,143 B2
(45) Date of Patent: Dec. 17, 2013

(54) MEMORY CIRCUIT USING SPIN MOSFETS, PATH TRANSISTOR CIRCUIT WITH MEMORY FUNCTION, SWITCHING BOX CIRCUIT, SWITCHING BLOCK CIRCUIT, AND FIELD PROGRAMMABLE GATE ARRAY

(75) Inventors: Hideyuki Sugiyama, Kawasaki (JP); Masato Oda, Yokohama (JP); Shinobu Fujita, Tokyo (JP); Tetsufumi Tanamoto, Kawasaki (JP); Mizue Ishikawa, Yokohama (JP); Takao Marukame, Tokyo (JP); Tomoaki Inokuchi, Yokohama (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/403,308

(22) Filed: Feb. 23, 2012

(65) Prior Publication Data

US 2012/0250399 A1    Oct. 4, 2012

(30) Foreign Application Priority Data

Mar. 28, 2011 (JP) ................................. 2011-070860

(51) Int. Cl.
*G11C 11/00* (2006.01)

(52) U.S. Cl.
USPC ............ 365/158; 365/171; 365/154; 365/156

(58) Field of Classification Search
USPC .................................. 365/158, 171, 154, 156
See application file for complete search history.

(56) References Cited

U.S. PATENT DOCUMENTS

| | | | |
|---|---|---|---|
| 6,717,844 B1 * | 4/2004 | Ohtani .......................... | 365/158 |
| 7,671,433 B2 * | 3/2010 | Sugahara et al. ............. | 257/421 |
| 2011/0194342 A1 | 8/2011 | Sugiyama et al. | |

FOREIGN PATENT DOCUMENTS

JP    2004-111904    4/2004

OTHER PUBLICATIONS

Satoshi Sugahara, et al., "Spin MOSFETs as a Basis for Spintronics", ACM Transactions on Storage, vol. 2, No. 2, May 2006, 23 pages.

\* cited by examiner

*Primary Examiner* — Connie Yoha
(74) *Attorney, Agent, or Firm* — Oblon, Spivak, McClelland, Maier & Neustadt, L.L.P.

(57) ABSTRACT

A memory circuit according to an embodiment includes: a first transistor including a first source/drain electrode, a second source/drain electrode, and a first gate electrode; a second transistor including a third source/drain electrode connected to the second source/drain electrode, a fourth source/drain electrode, and a second gate electrode; a third transistor and a fourth transistor forming an inverter circuit, the third transistor including a fifth source/drain electrode, a sixth source/drain electrode, and a third gate electrode connected to the second source/drain electrode, the fourth transistor including a seventh source/drain electrode connected to the sixth source/drain electrode, an eighth source/drain electrode, and a fourth gate electrode connected to the second source/drain electrode; and an output terminal connected to the sixth source/drain electrode. At least one of the third transistor and the fourth transistor is a spin MOSFET, and an output of the inverter circuit is sent from the output terminal.

14 Claims, 26 Drawing Sheets

MEMORY CIRCUIT USING SPIN MOSFETS, PATH TRANSISTOR CIRCUIT WITH MEMORY FUNCTION, SWITCHING BOX CIRCUIT, SWITCHING BLOCK CIRCUIT, AND FIELD PROGRAMMABLE GATE ARRAY

CROSS-REFERENCE TO RELATED APPLICATION

This application is based upon and claims the benefit of priority from prior Japanese Patent Application No. 2011-70860 filed on Mar. 28, 2011 in Japan, the entire contents of which are incorporated herein by reference.

FIELD

Embodiments described herein relate generally to a memory circuit using spin MOSFETs, a path transistor circuit with memory function, a switching box circuit, a switching block circuit, and a field programmable gate array.

BACKGROUND

With advance of the size shrinking technology in recent years, power consumption of LSIs becomes greater and power consumption of semiconductor memories at the time of standby becomes normegligible. The power gating technique is used to turn off the power supply for an unused part of an LSI and turn on the power supply only for a part in use. In current semiconductor technology, a volatile SRAM is used as a memory circuit and consequently the power supply cannot be turned off for the memory circuit. In a memory circuit using an SRAM or a DRAM which is volatile, sudden turnoff of the power supply causes loss of memory information.

As a nonvolatile memory circuit based on the current semiconductor technology, a nonvolatile memory of resistance change type is proposed. In the nonvolatile memory of resistance change type, information is stored in the SRAM which is a semiconductor memory when its power supply is turned on. Even if the power supply is turned off, information remains stored in the nonvolatile memory. When not performing a read or write operation, therefore, the power supply can be turned off. If a nonvolatile memory is used in an LSI, therefore, power gating can be performed easily. Accordingly, the nonvolatile memory of resistance change type is attracting attention.

Research and development of spin electronic devices utilizing the degree of spin freedom of electrons have been performed vigorously in recent years. Research and development based on a tunnel magnetoresistive effect (TMR) have been performed vigorously and applied to a magnetic random access memory (MRAM) and a hard disc drive (HDD). In addition, the spin transistor obtained by coupling semiconductor with a magnetic material is attracting attention.

The magnetic material can have a nonvolatile memory function. If the magnetic material is used as a nonvolatile memory, its application to the power gating technique and memory backup can be anticipated.

When fabricating a memory circuit by using the CMOS technique of the semiconductor, a volatile SRAM is used as a memory which stores information. Since the SRAM is volatile, the power supply cannot be turned off even at the time of standby, resulting in high power consumption. Furthermore, since the SRAM is volatile, memory information is lost at the time of sudden turnoff of the power supply. In the case where large quantities of SRAMs are used, power consumption due to a leak current becomes greater even when they are not operating. This results in a circuit which is hard to be highly integrated.

In addition, since the SRAM is a volatile memory which loses information if the power supply is turned off, it is necessary to write information stored in an external memory into the SRAM whenever the power supply is turned on. This results in a problem that it takes trouble and time when the power supply is turned on. Furthermore, when the SRAM is used, there is a problem that it is necessary to secure an external memory for storing information when the power supply is turned off, and power consumption and a capacity are needed for the external memory. Therefore, this becomes one of the causes which hinder higher integration and lower power consumption in the whole system.

Since the SRAM uses six devices for a 1-bit memory, there is a problem that it requires a larger area.

Furthermore, since the operation speed of the LSI is largely influenced by an interconnection delay, use of an SRAM having a large area as a memory makes the operation speed of the circuit low.

DETAILED DESCRIPTION

A memory circuit according to an embodiment includes: a first transistor which is a spin MOSFET of a first conductivity type, the first transistor including a first source/drain electrode, a second source/drain electrode, and a first gate electrode; a second transistor which is either a spin MOSFET of the first conductivity type or a MOSFET of the first conductivity type, the second transistor including a third source/drain electrode connected to the second source/drain electrode of the first transistor, a fourth source/drain electrode, and a second gate electrode; a third transistor and a fourth transistor forming an inverter circuit, the third transistor which is either a p-channel spin MOSFET or a p-channel MOSFET, the third transistor including a fifth source/drain electrode, a sixth source/drain electrode, and a third gate electrode connected to the second source/drain electrode of the first transistor, the fourth transistor which is either an n-channel spin MOSFET or an n-channel MOSFET, the fourth transistor including a seventh source/drain electrode connected to the sixth source/drain electrode of the third transistor, an eighth source/drain electrode, and a fourth gate electrode connected to the second source/drain electrode of the first transistor, and at least one of the third transistor and the fourth transistor in the inverter circuit being a spin MOSFET; and an output terminal connected to the sixth source/drain electrode of the third transistor, an output of the inverter circuit being sent from the output terminal.

Hereafter, embodiments will be described with reference to the drawings. However, the drawings are schematic, and sizes of respective components, levels of respective voltages, lengths respective time periods, ratios of sizes between components, ratios between voltages, time intervals and the like are different from actual values. Furthermore, even if the same component is shown in different drawings, the dimensions or ratios are shown to be different in some cases.

In memory circuits according to ensuing embodiments, spin MOSFETs are used in a nonvolatile memory. Therefore, the spin MOSFET will be described.

Figure 1:
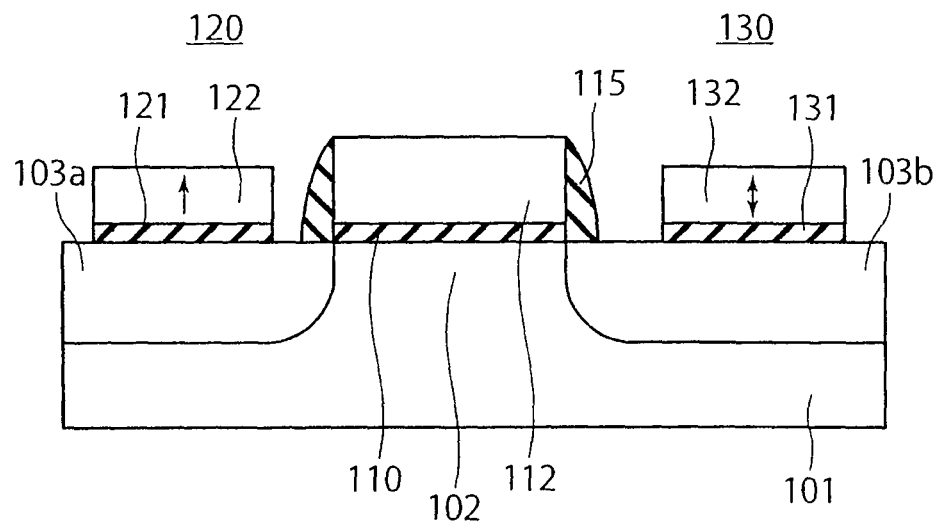
FIG. 1 is a sectional view showing a concrete example of a spin MOSFET.

The spin MOSFET will be described, taking an n-channel MOSFET as an example. A typical configuration of the MOSFET is shown in FIG. 1. In this spin MOSFET, n-type source and drain regions 103a and 103b are formed having a space inbetween in a p-type semiconductor region 101, a gate insulation film 110 is formed on a channel region 102 between the source region 103a and the drain region 103b, and a gate electrode 112 is formed on the gate insulation film 110. A gate side wall 115 formed of an insulation material is provided on a side face of the gate electrode 112. In addition, a source electrode 120 and a drain electrode 130 are formed on the source region 103a and the drain region 103b, respectively. The source electrode 120 includes a tunnel insulation film 121, which is provided on the source region 103a and which is formed of, for example, MgO, and a magnetization fixed layer 122 provided on the tunnel insulation film 121 and having a ferromagnetic layer of which magnetization is fixed. The drain electrode 130 includes a tunnel insulation film 131, which is provided on the drain region 103b and which is formed of, for example, MgO, and a magnetization free layer 132 provided on the tunnel insulation film 131 and having a ferromagnetic layer of magnetization is changeable. "Magnetization is fixed" means that the direction of the magnetization does not change between before and after a write current is caused to flow, whereas "magnetization is changeable" means that the direction of the magnetization might be switched between before and after a write current is caused to flow. The magnetization directions in both the magnetization fixed layer 122 and the magnetization free layer 132 can be perpendicular to the film surface, or can be parallel to the film surface. The film surface means the top surface of the ferromagnetic layer. Although the magnetization fixed layer 122 is provided over the source region 103a and the magnetization free layer is provided over the drain region 103b, it is also possible to provide the magnetization free layer 132 over the source region 103a and provide the magnetization fixed layer 122 over the drain region 103b. It is also possible to use magnetic semiconductor regions as the source region 103a and the drain region 103b. In this case, the tunnel insulation films 121 and 131 and the ferromagnetic layers 122 and 132 may not be provided.

If a gate voltage is applied to the gate electrode 112 in this MOSFET, spin polarized electrons flow from its source to its drain. In the spin MOSFET, there are two spin states: a parallel state and an anti-parallel state. In the parallel state, the magnetization directions of the magnetization fixed layer 122 and the magnetization free layer 132 are nearly parallel to each other. In the anti-parallel state, the magnetization directions of the magnetization fixed layer 122 and the magnetization free layer 132 are nearly anti-parallel to each other. Depending upon the states, a resistance value between the magnetization fixed layer 122 and the magnetization free layer 132 through the channel region 102 differs. The case where the resistance between the magnetization fixed layer 122 and the magnetization free layer 132 is low is referred to as low resistance state, whereas the case where the resistance between the magnetization fixed layer 122 and the magnetization free layer 132 is high is referred to as high resistance state. The low resistance state corresponds to the case where spin states of the magnetization fixed layer 122 and the magnetization free layer 132 are nearly parallel, whereas the high resistance state corresponds to the case where spin states of the magnetization fixed layer 122 and the magnetization free layer 132 are nearly anti-parallel. The case where the spin states of the magnetization fixed layer 122 and the magnetization free layer 132 are substantially parallel and the case where the spin states of the magnetization fixed layer 122 and the magnetization free layer 132 are substantially anti-parallel are retained until the spin state of the magnetization free layer 132 is switched by causing a write current to flow between the source and the drain, resulting in a memory function.

Switching of the magnetization direction in the magnetization free layer 132 can be performed by applying a gate voltage to the gate electrode 112, thereby turning on the spin MOSFET, and flowing a write current between the source electrode and the drain electrode through the channel 102. For example, in the case where the magnetization direction in the magnetization free layer 132 is substantially anti-parallel to the magnetization direction in the magnetization fixed layer 122, a current is caused to flow from the drain electrode 130 including the magnetization free layer 132 to the source electrode 120 including the magnetization fixed layer 122 through the channel 102. In this case, the flow of electrons is reverse in direction to the current flow, and consequently electrons flow from the source electrode 120 including the magnetization fixed layer 122 to the drain electrode 130 including the magnetization free layer 132 through the channel 102. At this time, the electrons are spin-polarized by the magnetization fixed layer 122, and the spin-polarized electrons flow into the magnetization free layer 132 through the channel 102. As a result, a spin torque acts upon the magnetization in the magnetization free layer and the magnetization direction in the magnetization free layer becomes substantially parallel to the magnetization direction in the magnetization fixed layer.

On the other hand, in the case where the magnetization direction in the magnetization free layer 132 is substantially parallel to the magnetization direction in the magnetization fixed layer 122, a current is caused to flow from the source electrode 120 including the magnetization fixed layer 122 to the drain electrode 130 including the magnetization free layer 132 through the channel 102. In this case, electrons flows from the source electrode 120 including the magnetization fixed layer 122 to the drain electrode 130 including the magnetization free layer 132 through the channel 102. At this time, the electrons are spin-polarized by the magnetization free layer 132, and the spin-polarized electrons flow into the magnetization fixed layer 122 through the channel 102. Electrons having spins having the same direction as those of the magnetization fixed layer 122 pass through the magnetization fixed layer 122. However, electrons having spins which are opposite in direction to those of the magnetization fixed layer 122 are reflected at an interface between the magnetization fixed layer 122 and the tunnel insulation film 121. The reflected electrons are stored in the magnetization free layer 132 through the channel 102, and acts a spin torque which is opposite in direction upon the magnetization in the magnetization free layer 132. As a result, the magnetization direction in the magnetization free layer 132 is switched, and the magnetization direction in the magnetization free layer 132 becomes substantially anti-parallel to the magnetization direction in the magnetization fixed layer 122.

In this way, the spin MOSFET needs a write current generation circuit which generates a current for switching the magnetization direction in the magnetization free layer 132, i.e., a write current. This write current generation circuit is known, and disclosed in, for example, JP-B-4435236. As for the current for reading out the resistance from the spin MOSFET, a current value which is smaller than the write current is selected to prevent the magnetization direction in the magnetization free layer 132 from being switched.

In the spin MOSFET, a write current is caused to flow from one of the source electrode and the drain electrode to the other in the case of writing. In some cases, therefore, the source electrode and the drain electrode are interchanged. Therefore, the source electrode or the drain electrode is expressed as source/drain electrode herein. For more clarification, one of the source electrode and the drain electrode is expressed as one of source/drain electrode whereas the other of the source electrode and the drain electrode is expressed as the other of source/drain electrode in some cases.

In the description of the spin MOSFET, each of the magnetization fixed layer and the magnetization free layer is a ferromagnetic layer of a single layer. However, at least one of the magnetization fixed layer and the magnetization free layer can have a stacked structure composed of a plurality of ferromagnetic layers and nonmagnetic layers sandwiched between them.

In this case, it is supposed that the magnetization direction in each of the magnetization fixed layer and the magnetization free layer is a magnetization direction in a ferromagnetic layer located nearest to a semiconductor region in which it is formed. In the ensuing description, it is supposed that each of the magnetization fixed layer and the magnetization free layer is a ferromagnetic layer of a single layer.

(First Embodiment)

Figure 2:
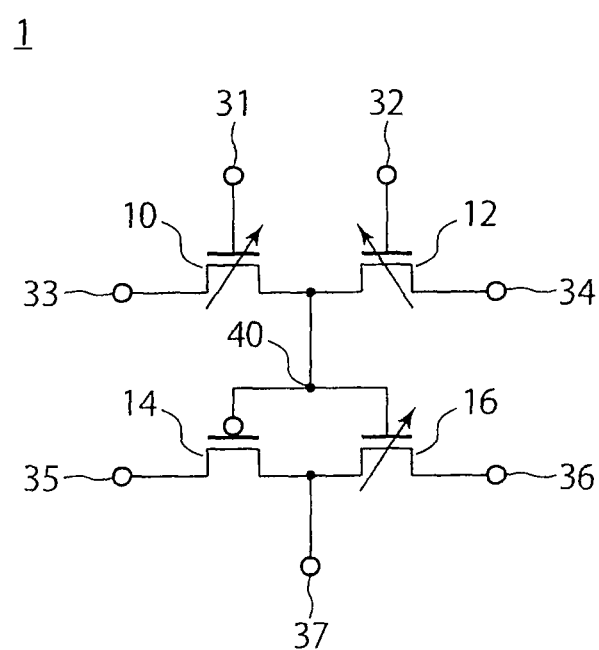
FIG. 2 is a circuit diagram showing a memory circuit according to a first embodiment.

A memory circuit according to a first embodiment is shown in FIG. 2. A memory circuit 1 in the first embodiment includes n-channel spin MOSFETs 10, 12 and 16 and a p-channel MOSFET 14. The spin MOSFET 10 is connected at its gate to a terminal 31, connected at one of its source/drain electrode to a terminal 33, and connected at the other of its source/drain electrode to a terminal 40. The spin MOSFET 12 is connected at its gate to a terminal 32, connected at one of its source/drain electrode to the terminal 40, and connected at the other of its source/drain electrode to a terminal 34. In other words, the spin MOSFETs 10 and 12 are connected in series. The MOSFET 14 is connected at its gate electrode to the terminal 40, connected at one of its source/drain electrode to a terminal 35, and connected at the other of its source/drain electrode to a terminal 37. The spin MOSFET 16 is connected at its gate electrode to the terminal 40, connected at one of its source/drain electrode to the terminal 37, and connected at the other of its source/drain electrode to a terminal 36. Therefore, the MOSFET 14 and the spin MOSFET 16 are connected in series, and they constitute an inverter circuit in which gates are connected to the terminal 40 in common.

In order to make the variation of electrical characteristics small, it is more desirable to design the spin MOSFETs 10 and 12 to have the same shape and to form the three spin MOSFETs 10, 12 and 16 in the same process. Each of the n-channel spin MOSFETs 10, 12 and 16 is formed in a p-well or a p-type semiconductor layer, and the p-channel MOSFET 14 is formed in an n-well or an n-type semiconductor layer.

In the present embodiment, the spin MOSFET 10 and the spin MOSFET 16 are brought to the same resistance state, i.e. a resistance state which is either of a high resistance state and a low resistance state, and the spin MOSFET 12 is set to be set to a resistance state which is opposite to that of the spin MOSFET 10. In this case, there are two kinds as regards a connection method of the magnetization fixed layer and the magnetization free layer in each of the spin MOSFETs 10 and 12.

Figure 3:
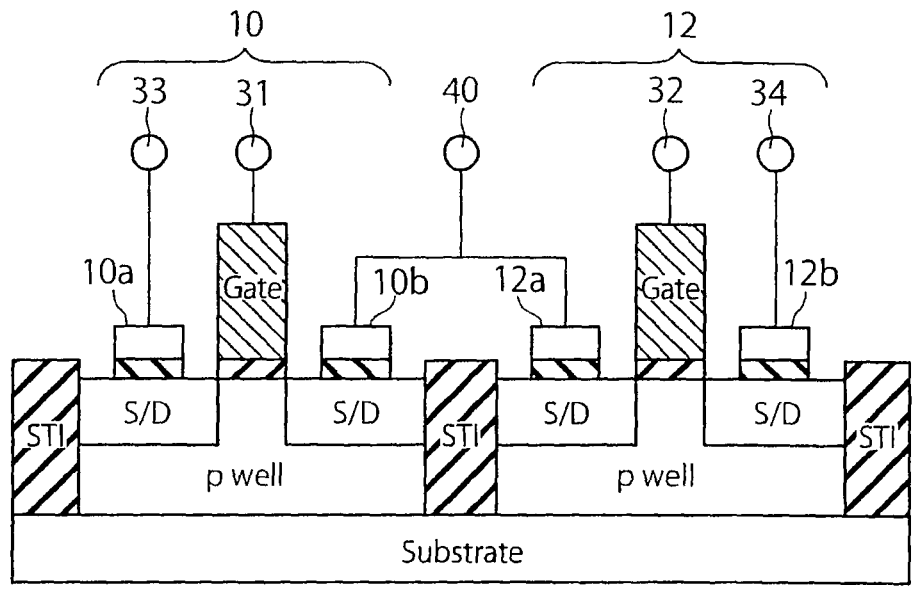
FIG. 3 is a sectional view showing an example of connection in the memory circuit according to the first embodiment.

In one connection method, a magnetic layer included in an electrode 10a, which is provided in one of the source/drain (hereafter also referred to as S/D) of the spin MOSFET 10 and connected to the terminal 33, is a magnetization fixed layer. A magnetic layer included in an electrode 10b, which is provided in the other of the S/D and connected to the terminal 40, is a magnetization free layer. Furthermore, a magnetic layer included in an electrode 12a, which is provided in one of the S/D of the spin MOSFET 12 and is also connected to the terminal 40, is a magnetization free layer, and a magnetic layer included in an electrode 12b, which is provided in the other of the S/D and is also connected to the terminal 34, is a magnetization fixed layer. In other words, the electrodes including magnetization free layers in the spin MOSFETs 10 and 12 are connected to the terminal 40. In this case, it is supposed that the spin MOSFET 10 is in the high resistance state and the spin MOSFET 12 is in the low resistance state. In other words, it is supposed that magnetization directions in the magnetization fixed layer 10a and the magnetization free layer 10b in the spin MOSFET 10 are substantially anti-parallel, and magnetization directions in the magnetization free layer 12a and the magnetization fixed layer 12b in the spin MOSFET 12 are substantially parallel. If, in this state, a high voltage is applied to gates to turn on both the spin MOSFET 10 and the MOSFET 12 and a write current is caused to flow from the terminal 34 to the terminal 33 via the spin MOSFET 12, the terminal 40 and the spin MOSFET 10, the spin MOSFET 10 is brought to a low resistance state and the spin MOSFET 12 is brought to a high resistance state. If a write current is then flowed from the terminal 33 to the terminal 34 via the spin MOSFET 10, the terminal 40 and the spin MOSFET 12, the spin MOSFET 10 is changed to a high resistance state and the spin MOSFET 12 is changed to a high resistance state. A method for changing the resistance state of the spin MOSFET 16 (write method) will be described later. Each of the spin MOSFETs 10 and 12 is formed in a p-well which is device-isolated by the STI (Shallow Trench Insulation) as shown in FIG. 3. These p-wells are formed on the same substrate.

Figure 4:
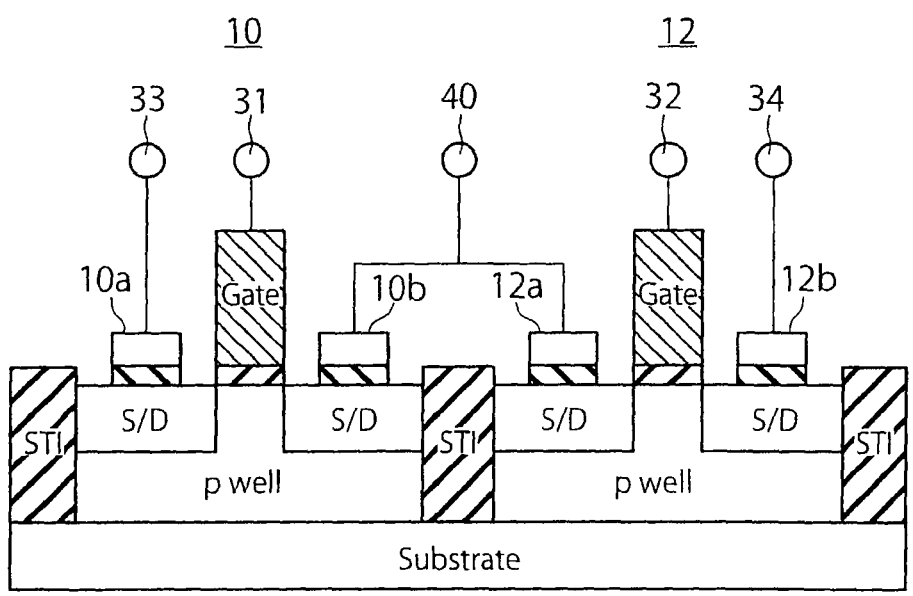
FIG. 4 is a sectional view showing another example of connection in the memory circuit according to the first embodiment.

As shown in FIG. 4, a magnetic layer included in the electrode 10a, which is provided in one of the S/D of the spin MOSFET 10 and connected to the terminal 33, is a magnetization free layer, and a magnetic layer included in the electrode 10b, which is provided in the other of the S/D and connected to the terminal 40, is a magnetization fixed layer. Furthermore, a magnetic layer included in an electrode 12a, which is provided in one of the S/D of the spin MOSFET 12 and connected to the terminal 40, is a magnetization fixed layer, and a magnetic layer included in the electrode 12b, which is provided in the other of the S/D and connected to the terminal 34, is a magnetization free layer. In other words, the electrodes including magnetization fixed layers in the spin MOSFETs 10 and 12 are connected to the terminal 40. In this case, it is supposed that the spin MOSFET 10 is in the low resistance state and the spin MOSFET 12 is in the high resistance state. In other words, it is supposed that magnetization directions in the magnetization free layer 10a and the magnetization fixed layer 10b in the spin MOSFET 10 are parallel, and magnetization directions in the magnetization fixed layer 12a and the magnetization free layer 12b in the spin MOSFET 12 are anti-parallel. If, in this state, a high voltage is applied to gates to turn on both the spin MOSFET 10 and the MOSFET 12 and a write current is flowed from the terminal 34 to the terminal 33 via the spin MOSFET 12, the terminal 40 and the spin MOSFET 10. Consequently, the spin MOSFET 10 is changed to a high resistance state and the spin MOSFET 12 is changed to a low resistance state. If a write current is then flowed from the terminal 33 to the terminal 34 via the spin MOSFET 10, the terminal 40 and the spin MOSFET 12, then the spin MOSFET 10 is changed to a low resistance state and the spin MOSFET 12 is changed to a high resistance state.

Operations of the memory circuit 1 in the first embodiment will be described with reference to FIGS. 5 and 6. In the ensuing description of the operations, the source electrode, the drain electrode, and the gate electrode are also referred to as source, drain and gate, respectively.

(Reading Method)

A reading operation of a memory circuit according to the first embodiment will be described.

Figure 5:
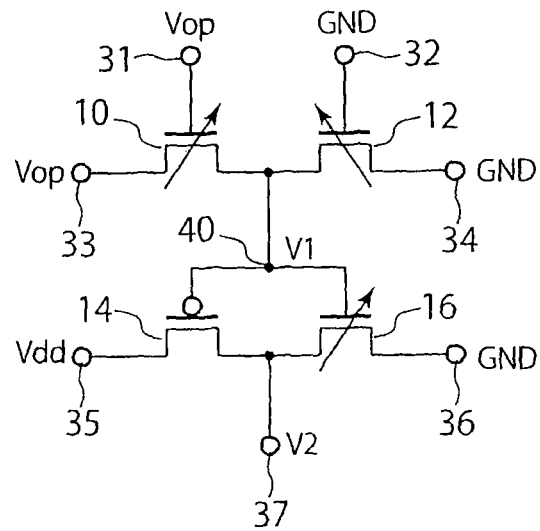
FIG. 5 is a diagram showing voltages applied to respective terminals in the memory circuit according to the first embodiment.

First, as shown in FIG. 5, an operation voltage Vop is applied to the terminals 31 and 33, a reference voltage GND is applied to the terminals 32, 34 and 36, and a power supply voltage Vdd is applied to the terminal 35. The power supply voltage Vdd is a voltage which is sufficiently higher than a threshold voltage Vth of the spin MOSFETs 10, 12 and 16 with respect to a reference voltage GND. In other words, Vdd>Vth+GND. Furthermore, the reference voltage GND is applied to each of p-wells in which the spin MOSFETs 10, 12 and 16 are formed, and the power supply voltage Vdd is applied to an n-well in which the MOSFET 14 is formed. A voltage (intermediate voltage) at the intermediate node (terminal) 40 between the spin MOSFET 10 and the spin MOSFET 12 is referred to as V1, and a voltage at the terminal 37 is referred to as output voltage V2. Furthermore, the operation voltage Vop is set to a high voltage which is at least half of the power supply voltage Vdd, i.e. Vdd/2.

When a voltage Vgs between the gate and source of a transistor, i.e., a spin MOSFET or a MOSFET, is lower than the threshold voltage Vth of the transistor, little current flows between the source and drain of the transistor, resulting in a very high resistance. This state is herein defined as an off-state. When the voltage Vgs between the gate and source of the transistor is higher than the threshold voltage Vth, the source and drain of the transistor are electrically connected, resulting in a low resistance. This state is defined as an on-state.

Since the n-channel spin MOSFET 12 is supplied, at its gate, with the reference voltage GND, the n-channel spin MOSFET 12 is set to the off-state on the basis of the definition. A voltage Vgs1 between the gate and source of the spin MOSFET 10 is represented by: Vgs1=Vop−V1. Since the spin MOSFET 12 is in the off-state, the voltage V1 is a high voltage, and the voltage Vgs1 between the gate and source is a low voltage. Since the voltage Vgs1 is low, the n-channel spin MOSFET 10 is also set to the off-state. The voltage V1 depends upon resistance values of the spin MOSFET 10 and the spin MOSFET 12 which are both in the off-state. The resistance of the spin MOSFET 10 and the spin MOSFET 12 depends upon the magnetization directions in the magnetization fixed layer and the magnetization free layer in the spin MOSFET.

The MOSFET 14 and the spin MOSFET 16 constitute an inverter circuit. The voltage V1 at the intermediate node 40 becomes an input voltage of the inverter circuit, and the voltage V2 at the terminal 37 becomes an output voltage of the inverter circuit.

First, the case where the spin MOSFET 10 and the spin MOSFET 16 are in the high resistance state and the spin MOSFET 12 is in the low resistance state will be described. In this case, the intermediate voltage V1 is a low voltage V1L. Furthermore, input-output characteristics of the inverter circuit formed of the spin MOSFET 14 and the spin MOSFET 16 are shown in a graph $g_1$ in FIG. 6. At this time, the input voltage V1 is the low voltage V1L. Therefore, the input voltage V1 and the output voltage V2 assume an operating point $OP_1$ shown in FIG. 6. Therefore, the output voltage V2 assumes a value close to the power supply voltage Vdd.

Then, the case where the spin MOSFET 10 and the spin MOSFET 16 are in the low resistance state and the spin MOSFET 12 is in the high resistance state will be described. In this case, the voltage V1 at the intermediate node 40 is a high voltage V1H. And input-output characteristics of the inverter circuit are shown in a graph $g_2$ in FIG. 6. At this time, the input voltage V1 is the high voltage V1H. Therefore, the input voltage V1 and the output voltage V2 assume an operating point $OP_2$ shown in FIG. 6. Accordingly, the output voltage V2 assumes a value close to the reference voltage GND.

Figure 6:
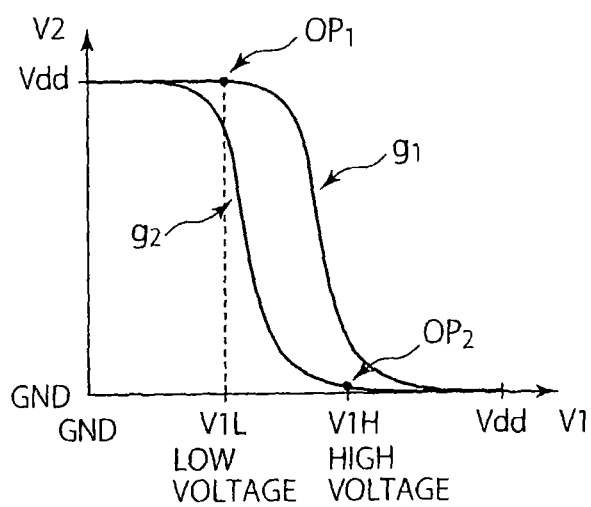
FIG. 6 is a diagram showing voltage characteristics of the memory circuit according to the first embodiment.

As described above, depending upon the resistance states of the spin MOSFETs 10, 12 and 16, the output voltage V2 can be stabilized to either the value close to the reference voltage GND or the value close to the power supply voltage Vdd, as shown in FIG. 6. In this way, it is possible in the first embodiment to obtain a stable bi-valued output depending upon the resistance states of the spin MOSFETs. As a result, operation as a nonvolatile memory can be implemented.

In the present embodiment, the spin MOSFET 10 and the spin MOSFET 12 are in the off state. Therefore, the current flowing from the terminal 33 to the terminal 34 is very little. As a result, power consumption caused by the spin MOSFET 10 and the spin MOSFET 12 is very low. Furthermore, the inverter circuit formed of the MOSFET 14 and the spin MOSFET 16 is set to have an operating point close to Vdd or GND owing to the characteristics of the spin MOSFET 16. As a result, the power consumption of the inverter circuit is very low.

(Writing Method)

A writing method in the memory circuit 1 according to the first embodiment will be described. In the writing method of the memory circuit according to the first embodiment, the resistance states of the spin MOSFETs are written by using a spin torque transfer switching method. In the spin torque transfer switching, the resistance state can be rewritten by flowing a current, which is equal to or greater than a magnetization switching current (also referred to as switching current), flow between the source and drain of the spin MOSFET.

Figure 7:
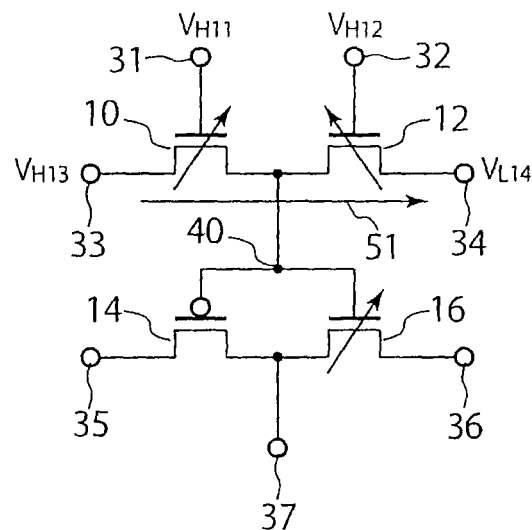
FIG. 7 is a diagram for explaining a writing method in the memory circuit according to the first embodiment.
Figure 8:
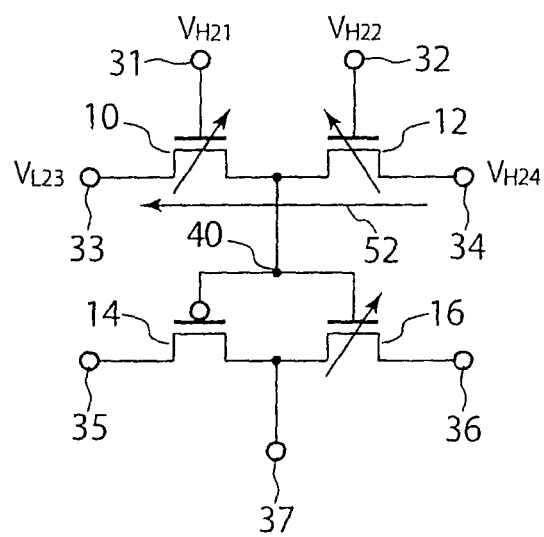
FIG. 8 is a diagram for explaining a writing method in the memory circuit according to the first embodiment.

When performing writing into the spin MOSFET 10 and the spin MOSFET 12, it is performed by flowing a write current through a current path 51 shown in FIG. 7 and a current path 52 shown in FIG. 8

First, the case where a write current is flowed through the current path 51 shown in FIG. 7 will be described. The spin MOSFET 10 and the spin MOSFET 12 are set to the on-state by applying a high voltage VH11 to the terminal 31, i.e., the gate of the spin MOSFET 10, and applying a high voltage VH12 to the terminal 32, i.e., the gate of the spin MOSFET 12. A large current which is greater than the switching current is flowed through the current path 51 between the terminal 33 and the terminal 34 by applying a high voltage VH13 which is nearly equal to or higher than the power supply voltage Vdd to the terminal 33 and applying a low voltage VL14 which is equal to the reference voltage GND or less to the terminal 34. The resistance states of the spin MOSFETs 10 and 12 can be changed by flowing a large current through the current path 51.

Then, the case where a write current is flowed through the current path 52 shown in FIG. 8 will be described. The spin MOSFET 10 and the spin MOSFET 12 are set to the on-state by applying a high voltage VH21 to the terminal 31 and applying a high voltage VH22 to the terminal 32. A large current which is greater than the switching current is flowed from the terminal 34 to the terminal 33 by applying a low voltage VH23 which is equal to the reference voltage GND or less to the terminal 33 and applying a high voltage VH24 which is nearly equal to or higher than the power supply voltage Vdd to the terminal 34. The resistance states of the spin MOSFETs 10 and 12 can be changed by flowing a large current through the current path 52.

Figure 9:
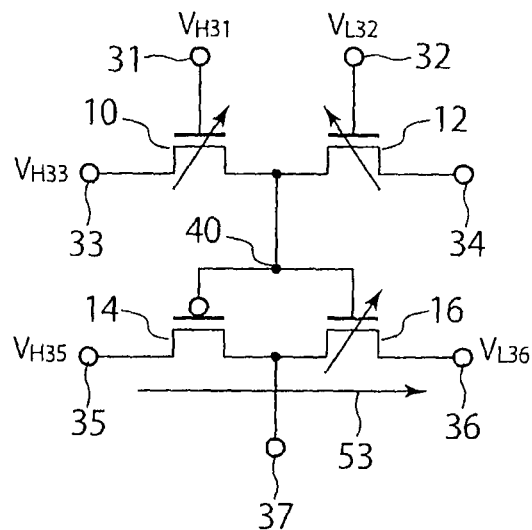
FIG. 9 is a diagram for explaining a writing method in the memory circuit according to the first embodiment.
Figure 10:
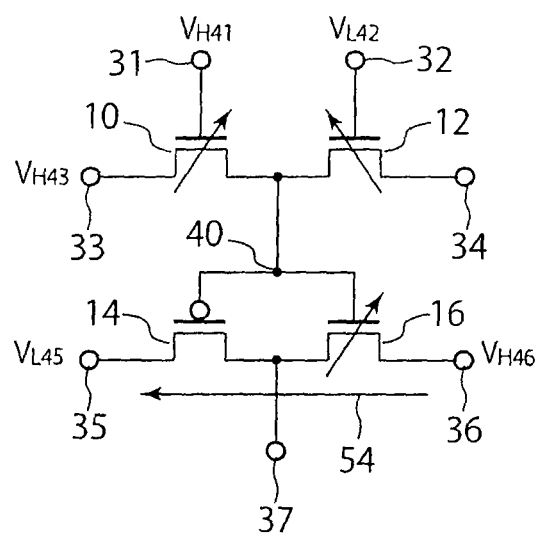
FIG. 10 is a diagram for explaining a writing method in the memory circuit according to the first embodiment.

When performing writing into the spin MOSFET 16, it is performed by flowing a write current through a current path 53 shown in FIG. 9 and a current path 54 shown in FIG. 10.

First, the case where a current is flowed through the current path 53 as shown in FIG. 9 will be described. The spin MOSFET 10 is set to the on-state and the spin MOSFET 12 is set to the off-state by applying a high voltage VH31 to the terminal 31 and applying a low voltage VL32 to the terminal 32. A high voltage VH35 which is nearly equal to or higher than the power supply voltage Vdd is applied to the terminal 35, and a low voltage VL36 which is equal to the reference voltage GND or less is applied to the terminal 36. Denoting a threshold voltage of the MOSFET 14 by Vth3 and denoting a threshold voltage of the spin MOSFET 16 by Vth4, a voltage VH33 at the terminal 33 is set to cause the voltage V1 at the terminal 40 to satisfy the following relation.

$$VL36+Vth4 < V1 < VH35-Vth3$$

As a result, a large current flows through the current path 53 between the terminal 35 and the terminal 36. The resistance state of the spin MOSFET 16 can be changed by flowing a large current through the current path 53.

Then, the case where a write current is flowed through the current path 54 as shown in FIG. 10 will be described. The spin MOSFET 10 is set to the on-state and the spin MOSFET 12 is set to the off-state by applying a high voltage VH41 to the terminal 31 and applying a low voltage VL42 to the terminal 32. A high voltage VH46 which is nearly equal to or higher than the power supply voltage Vdd is applied to the terminal 36, and a low voltage VL45 which is equal to the reference voltage GND or less is applied to the terminal 35. Denoting a threshold voltage of the MOSFET 14 by Vth3 and denoting a threshold voltage of the spin MOSFET 16 by Vth4, the applied voltages VH46 and VH45 are set to cause the voltage V1 at the terminal 40 to satisfy the following relation.

$$VL45+Vth3 < V1 < VH46-Vth4$$

As a result, a large current flows through the current path 54 between the terminal 36 and the terminal 35. Magnetizations in the magnetization fixed layer and the magnetization free layer in the spin MOSFET 16 are disposed to set the spin MOSFET 16 to a low resistance state by flowing a large current through the current path 54.

In the present embodiment, disposition is performed to bring the spin MOSFET 10 to the high resistance state and the spin MOSFET 12 to the low resistance state by flowing a large current through the current path 51, thereby setting the spin MOSFET 10 to the low resistance state, and to set the spin MOSFET 12 to the high resistance state by flowing a large current through the current path 52. Magnetizations of the ferromagnetic materials in the source electrode/drain electrode in the spin MOSFET 10 and the spin MOSFET 12 can be disposed to set the spin MOSFET 10 to the low resistance state and the spin MOSFET 12 to the high resistance state by flowing a large current through the current path 51, and to set the spin MOSFET 10 to the high resistance state and the spin MOSFET 12 to the low resistance state by flowing a large current through the current path 52.

In the present embodiment, disposition is performed to set the spin MOSFET 16 to the high resistance state by flowing a large current through the current path 53, and to set the spin MOSFET 16 to the low resistance state by flowing a large current through the current path 54. Magnetization of the ferromagnetic material in the source electrode/drain electrode in the spin MOSFET 16 can be disposed to set the spin MOSFET 16 to the low resistance state by flowing a large current through the current path 53, and to set the spin MOSFET 16 to the high resistance state by flowing a large current through the current path 54.

As described heretofore, the memory circuit according to the first embodiment is formed of four transistors, i.e., three spin MOSFETs 10, 12 and 16 and the MOSFET 14. In the memory circuit according to the first embodiment, therefore, a memory can be constituted with a smaller number of transistors than a SRAM, and a memory circuit having a small area can be implemented.

Using the memory circuit according to the first embodiment, a memory circuit having a small area can be implemented. If the memory circuit according to the first embodiment is used, therefore, not only higher integration becomes possible in an LSI, but also a fast circuit can be implemented because of a shorter interconnection delay in the logic circuit.

In the first embodiment, the spin MOSFET uses a scheme in which magnetization of a ferromagnetic material in the spin MOSFET is switched by causing a write current to from one of the source/drain to the other, i.e., the spin torque transfer switching scheme. Alternatively, it is also possible to dispose an interconnection in a position near a spin MOSFET, flow a current through this interconnection, and switch magnetization in a ferromagnetic material in the spin MOSFET by means of a magnetic field induced by a current flowing through the wiring.

The spin MOSFET used in the first embodiment is nonvolatile. Even if the power supply is turned off, therefore, the resistance state is maintained. When the memory circuit according to the first embodiment is not used, therefore, it is possible to turn off the power supply and the power consumption can be lowered. Furthermore, even if the power supply is suddenly turned off, memory information is maintained and consequently a memory for backup becomes unnecessary. As a result, the whole system can be made small.

Furthermore, in the first embodiment, the spin MOSFET is used as the nonvolatile memory. As a result, a memory circuit having tolerance for rewriting can be implemented.

Furthermore, according to the first embodiment, it is to make the variation in electric characteristics very small by fabricating spin MOSFETs in the same process. As a result, a nonvolatile memory circuit having a high yield can be obtained.

(First Modification)

Figure 11:
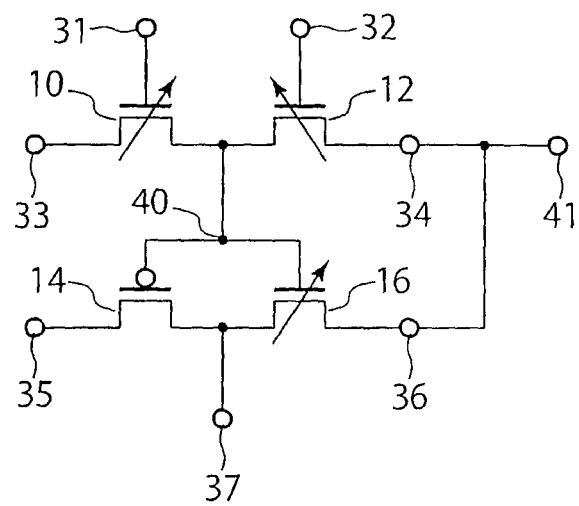
FIG. 11 is a circuit diagram showing a memory circuit according to a first modification of the first embodiment.

A memory circuit according to a first modification of the first embodiment is shown in FIG. 11. A memory circuit 1A according to the first modification has a configuration obtained by interconnecting the terminal 34 and the terminal 36 in the memory circuit 1 of the first embodiment shown in FIG. 2 to form a terminal 41. The memory circuit 1A according to the first modification is more desirable because the number of terminals is reduced as compared with the memory circuit 1 according to the first embodiment shown in FIG. 2.

In the first modification as well, a memory circuit which has a high speed, nonvolatility, and low power consumption can be obtained in the same way as the first embodiment.

(Second Modification)

Figure 12:
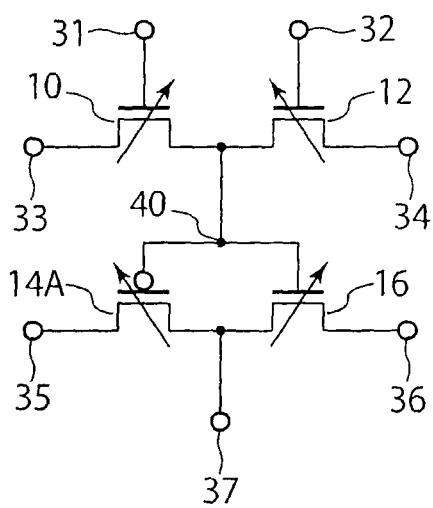
FIG. 12 is a circuit diagram showing a memory circuit according to a second modification of the first embodiment.

A memory circuit according to a second modification of the first embodiment is shown in FIG. 12. A memory circuit 1B according to the second modification has a configuration obtained by replacing the p-channel MOSFET 14 with a p-channel spin MOSFET 14A in the memory circuit 1 of the first embodiment shown in FIG. 2. In this case, one of the p-channel spin MOSFET 14A and the n-channel spin MOSFET 16 is in a high resistance state, whereas the other is set to a low resistance state. Furthermore, an inverter circuit formed of the spin MOSFET 14A and the spin MOSFET 16 is set to cause an operating point to have a value which is stably close to Vdd or GND depending upon characteristics of the spin MOSFET 14A and the spin MOSFET 16.

At the time of reading, voltages are applied to respective terminals in the same way as the first embodiment.

Furthermore, as for a writing method, data can be written into the spin MOSFET 14A as well nearly at the same time as the spin MOSFET 16 in accordance with a procedure for writing data into the spin MOSFET 16.

In the case where the p-channel spin MOSFET 14A is used as in the second modification, there is a desirable advantage that the power consumption of the inverter circuit becomes stably lower as compared with the first embodiment.

Also in the second modification, a memory circuit which has a high speed, nonvolatility, and low power consumption can be obtained in the same way as the first embodiment.

(Third Modification)

Figure 13:
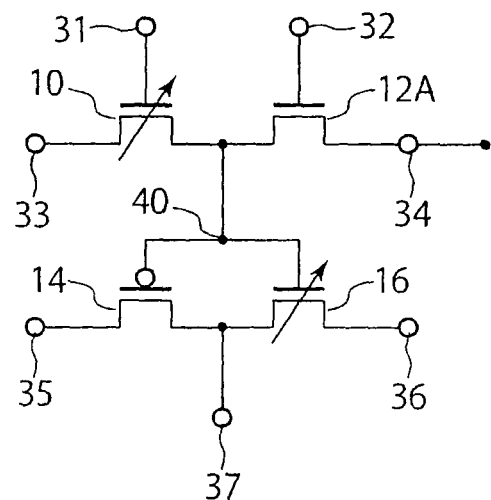
FIG. 13 is a circuit diagram showing a memory circuit according to a third modification of the first embodiment.

A memory circuit according to a third modification of the first embodiment is shown in FIG. 13. A memory circuit 1C according to the third modification has a configuration obtained by replacing the n-channel spin MOSFET 12 with an n-channel MOSFET 12A in the memory circuit 1 of the first embodiment shown in FIG. 2. Also in the third modification, voltages are applied to respective terminals in the same way as the first embodiment, at the time of reading.

Also in the third modification, a memory circuit which has a high speed, nonvolatility, and low power consumption can be obtained in the same way as the first embodiment.

(Fourth Modification)

Figure 14:
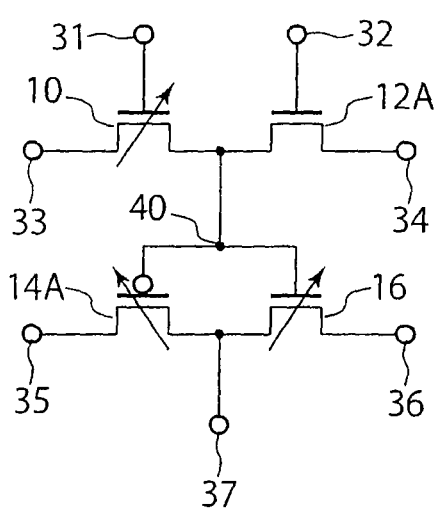
FIG. 14 is a circuit diagram showing a memory circuit according to a fourth modification of the first embodiment.

A memory circuit according to a fourth modification of the first embodiment is shown in FIG. 14. A memory circuit 1D according to the fourth modification has a configuration obtained by replacing the n-channel spin MOSFET 12 with the n-channel MOSFET 12A in the memory circuit 1B of the second modification shown in FIG. 12. In this case, one of the p-channel spin MOSFET 14A and the n-channel spin MOSFET 16 is in a high resistance state, whereas the other is set to a low resistance state.

Also in the fourth modification, at the time of reading, voltages are applied to respective terminals in the same way as the second modification.

In the fourth modification, there is also a desirable advantage in the same way as the second modification that the power consumption of the inverter circuit becomes stably lower as compared with the first embodiment.

Also in the fourth modification, a memory circuit which has a high speed, nonvolatility, and low power consumption can be obtained in the same way as the first embodiment.

(Fifth Modification)

Figure 15:
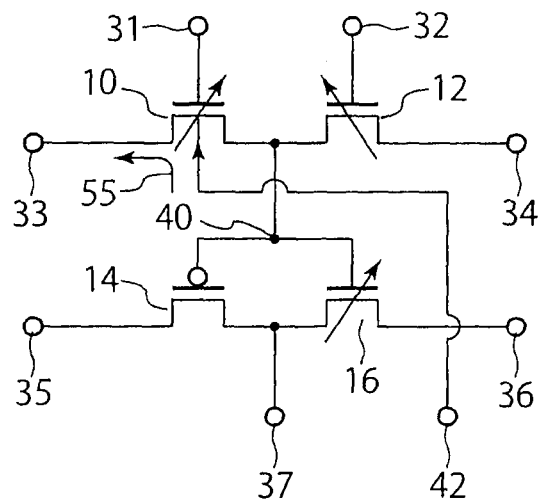
FIG. 15 is a diagram for explaining a writing method in the memory circuit according to a fifth modification of the first embodiment.

A memory circuit according to a fifth modification of the first embodiment will be described with reference to FIG. 15. A memory circuit 1E according to the fifth modification has a configuration obtained by changing the writing method for the spin MOSFET 10 in the memory circuit 1 of the first embodiment shown in FIG. 1. It is possible to flow a write current through a current path 55 and switch the magnetization in the magnetization free layer in the spin MOSFET 10 by applying a high voltage to a p-well terminal 42 connected to a p-well in which the spin MOSFET 10 is provided and applying a low voltage to the terminal 33 as shown in FIG. 15.

(Sixth Modification)

Figure 16:
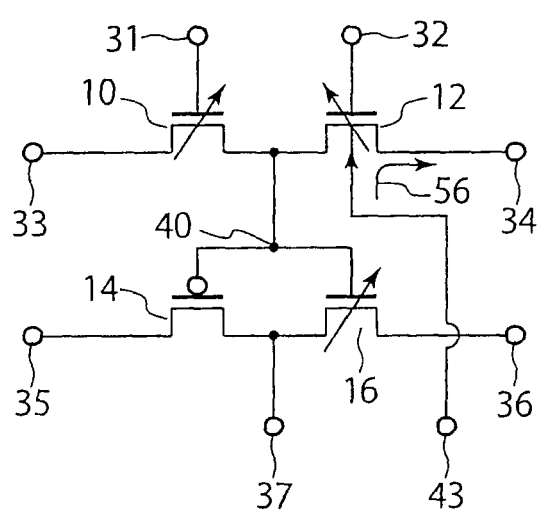
FIG. 16 is a diagram for explaining a writing method in the memory circuit according to a sixth modification of the first embodiment.

A memory circuit according to a sixth modification of the first embodiment will be described with reference to FIG. 16. A memory circuit 1F according to the sixth modification has a configuration obtained by changing the writing method for the spin MOSFET 12 in the memory circuit 1 of the first embodiment shown in FIG. 1. It is possible to flow a write current through a current path 56 and switch the magnetization in the magnetization free layer in the spin MOSFET 12 by applying a high voltage to a p-well terminal 43 connected to a p-well in which the spin MOSFET 12 is provided and applying a low voltage to the terminal 34 as shown in FIG. 16.

(Seventh Modification)

Figure 17:
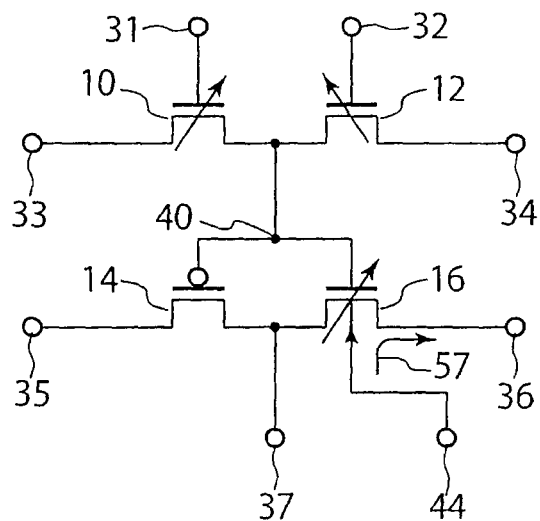
FIG. 17 is a diagram for explaining a writing method in the memory circuit according to a seventh modification of the first embodiment.

A memory circuit according to a seventh modification of the first embodiment will be described with reference to FIG. 17. A memory circuit 1G according to the seventh modification has a configuration obtained by changing the writing method for the spin MOSFET 16 in the memory circuit 1 of the first embodiment shown in FIG. 1. It is possible to flow a write current through a current path 57 and switch the magnetization in the magnetization free layer in the spin MOSFET 16 by applying a high voltage to a p-well terminal 44 connected to a p-well in which the spin MOSFET 16 is provided and applying a low voltage to the terminal 36 as shown in FIG. 17.

(Eighth Modification)

Figure 18:
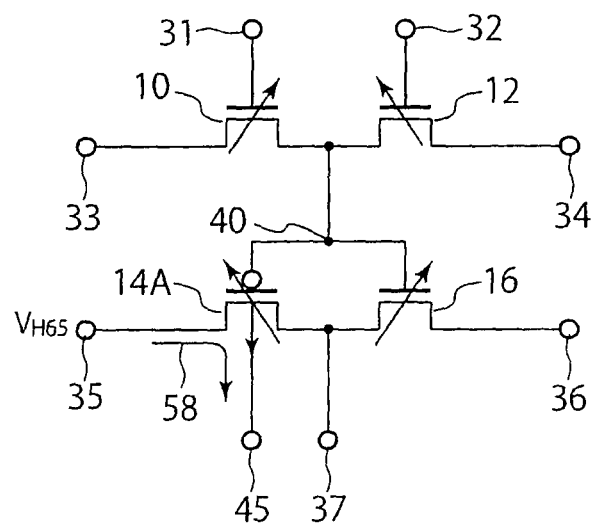
FIG. 18 is a diagram for explaining a writing method in the memory circuit according to an eighth modification of the first embodiment.

A memory circuit according to an eighth modification of the first embodiment will be described with reference to FIG. 18. A memory circuit 1H according to the eighth modification has a configuration obtained by changing the writing method for the spin MOSFET 14A in the memory circuit 1B of the second modification shown in FIG. 12. It is possible to flow a write current through a current path 58 and switch the magnetization in the magnetization free layer in the spin MOSFET 14A by applying a low voltage to an n-well terminal 45 connected to an n-well in which the spin MOSFET 14A is provided and applying a high voltage to the terminal 35 as shown in FIG. 18.

(Ninth Modification)

Figure 19:
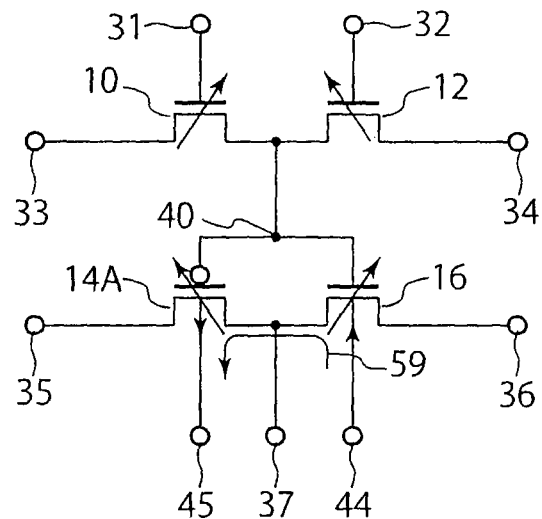
FIG. 19 is a diagram for explaining a writing method in the memory circuit according to a ninth modification of the first embodiment.

A memory circuit according to a ninth modification of the first embodiment will be described with reference to FIG. 19. A memory circuit 1I according to the ninth modification has a configuration obtained by changing the writing method for the p-channel spin MOSFET 14A and the n-channel spin MOSFET 16 in the memory circuit 1B of the second modification shown in FIG. 12. It is possible to flow a write current through a current path 59 and switch the magnetization in the magnetization free layer in at least one of the p-channel spin MOSFET 14A and the n-channel spin MOSFET 16 by applying a low voltage to the n-well terminal 45 connected to the n-well in which the spin MOSFET 14A is provided and applying a high voltage to the p-well terminal 44 connected to the p-well in which the spin MOSFET 16 is provided as shown in FIG. 19.

(Second Embodiment)

A memory circuit according to a second embodiment will be described with reference to FIGS. 20 and 21.

Figure 20:
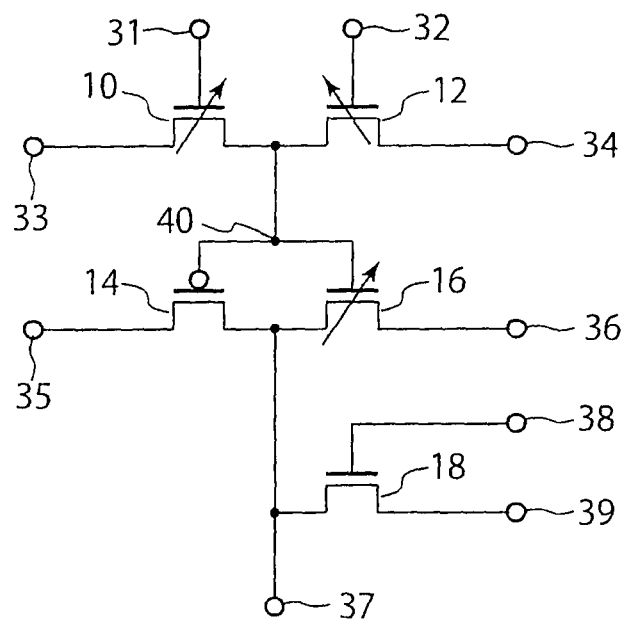
FIG. 20 is a circuit diagram showing a memory circuit according to a second embodiment.

The memory circuit according to the second embodiment is shown in FIG. 20. A memory circuit 2 according to the second embodiment has a configuration obtained by newly providing an n-channel MOSFET 18 connected at one of its source/drain electrode to the terminal 37, connected at the other of its source/drain electrode to a terminal 39, and connected at its gate to a terminal 38 in the memory circuit 1 of the first embodiment shown in FIG. 2. The MOSFET 18 is provided to perform writing into the n-channel spin MOSFET 16.

In the second embodiment, at the time of reading, a low voltage is applied to the terminal 38 to set the MOSFET 18 to the off-state.

Figure 21:
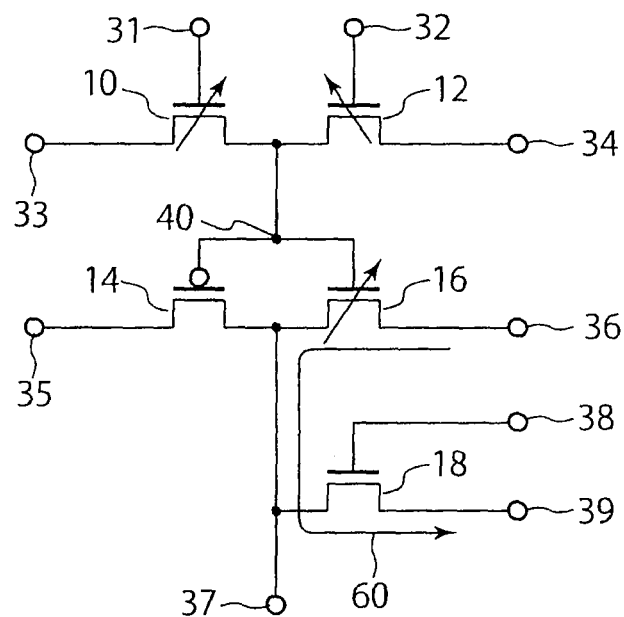
FIG. 21 is a diagram for explaining an example of a writing method in the memory circuit according to the second embodiment.

When performing writing into the spin MOSFET 16, it is performed by flowing a current through a current path 60 shown in FIG. 21, i.e., from the terminal 36 to the terminal 39 via the MOSFET 16 and the MOSFET 18. Hereafter, the writing method will be described.

The voltage V1 at the terminal 40 is brought to the high voltage to set the spin MOSFET 16 to the on-state by applying a high voltage to the terminal 31, a low voltage to the terminal 32 and a high voltage to the terminal 33. The voltage V1 at the terminal 40 can be set to the high voltage to set the spin MOSFET 16 to the on-state by applying a low voltage to the terminal 31, a high voltage to the terminal 32 and a high voltage to the terminal 34.

Furthermore, a high voltage is applied to the terminal 38 to bring the MOSFET 18 to the on-state.

A positive current is flowed through the current path 60 by applying a high voltage, which is nearly equal to or higher than the power supply voltage Vdd, to the terminal 36 and applying a low voltage, which is equal to the reference voltage GND or less, to the terminal 39. Or a negative current (a current which is opposite in direction to the positive current) is flowed through the current path 60 by applying a low voltage, which is equal to the reference voltage GND or less, to the terminal 36 and applying a high voltage, which is nearly equal to or higher than the power supply voltage Vdd, to the terminal 39. As a result, a current which is large in absolute value flows through the current path 60 between the terminal 36 and the terminal 39. The magnetization fixed layer and the magnetization free layer in the spin MOSFET 16 are disposed to set the spin MOSFET 16 to the high resistance state by flowing the positive current through the current path 60, and to set the spin MOSFET 16 to the low resistance state by flowing the negative current through the current path 60. The magnetization fixed layer and the magnetization free layer in the spin MOSFET 16 can be disposed to set the spin MOSFET 16 to the low resistance state by flowing the positive current through the current path 60, and to set the spin MOSFET 16 to the high resistance state by flowing the negative current through the current path 60.

According to the second embodiment, the memory circuit can be implemented by using three spin MOSFETs and two MOSFETs, i.e., a total of five transistors, as described heretofore. As a result, a memory circuit having a small area can be implemented.

Also in the second embodiment, a memory circuit which has a high speed, nonvolatility, and low power consumption can be obtained in the same way as the first embodiment.

In addition, according to the second embodiment, the spin MOSFET is used as the nonvolatile memory. As a result, a memory circuit having tolerance for rewriting can be implemented.

Furthermore, according to the second embodiment, it is possible to make the variation in electric characteristics very small by fabricating spin MOSFETs in the same process. As a result, a nonvolatile memory circuit having a high yield can be obtained.

(First Modification)

Figure 22:
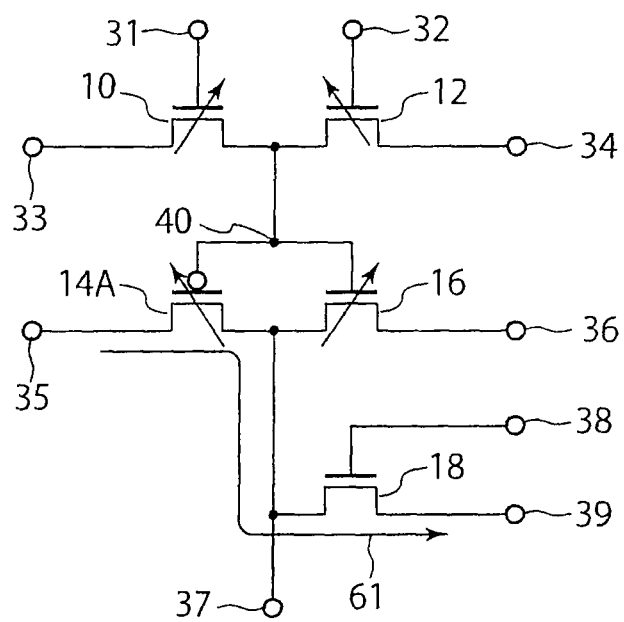
FIG. 22 is a circuit diagram showing a memory circuit according to a first modification of the second embodiment.

A memory circuit according to a first modification of the second embodiment is shown in FIG. 22. A memory circuit 2A according to the first modification has a configuration obtained by replacing the p-channel MOSFET 14 with the p-channel spin MOSFET 14A in the memory circuit 2 of the second embodiment shown in FIG. 20.

In the first modification, writing into the p-channel spin MOSFET 14A is performed by flowing a current through a write current path 61 shown in FIG. 22. Hereafter, the writing method will be described.

The voltage V1 at the terminal 40 is set to the low voltage to bring the spin MOSFET 14A to the on-state by applying a high voltage to the terminal 31, a low voltage to the terminal 32 and a high voltage to the terminal 33. Or the voltage V1 at the terminal 40 can be set to the low voltage to set the spin MOSFET 14A to the on-state by applying a low voltage to the terminal 31, a high voltage to the terminal 32 and a low voltage to the terminal 34.

Furthermore, a high voltage is applied to the terminal 38 to bring the MOSFET 18 to the on-state. A positive current is flowed through the current path 61 by applying a high voltage, which is nearly equal to or higher than the power supply voltage Vdd, to the terminal 35 and applying a low voltage, which is equal to the reference voltage GND or less, to the terminal 39. Or a negative current is flowed through the current path 61 by applying a low voltage, which is equal to the reference voltage GND or less, to the terminal 35 and applying a high voltage, which is nearly equal to or higher than the power supply voltage Vdd, to the terminal 39. As a result, a current which is large in absolute value flows through the current path 61 between the terminal 36 and the terminal 39.

The magnetization fixed layer and the magnetization free layer in the spin MOSFET 14A are disposed to set the spin MOSFET 14A to the low resistance state by flowing the positive current through the current path 61, and to set the spin MOSFET 14A to the high resistance state by flowing the negative current through the current path 61. Or the magnetization fixed layer and the magnetization free layer in the spin MOSFET 14A can be disposed to set the spin MOSFET 14A to the high resistance state by flowing the positive current through the current path 61, and to set the spin MOSFET 14A to the low resistance state by flowing the negative current through the current path 61.

Also in the first modification, effects similar to those of the second embodiment can be obtained.

(Second Modification)

Figure 23:
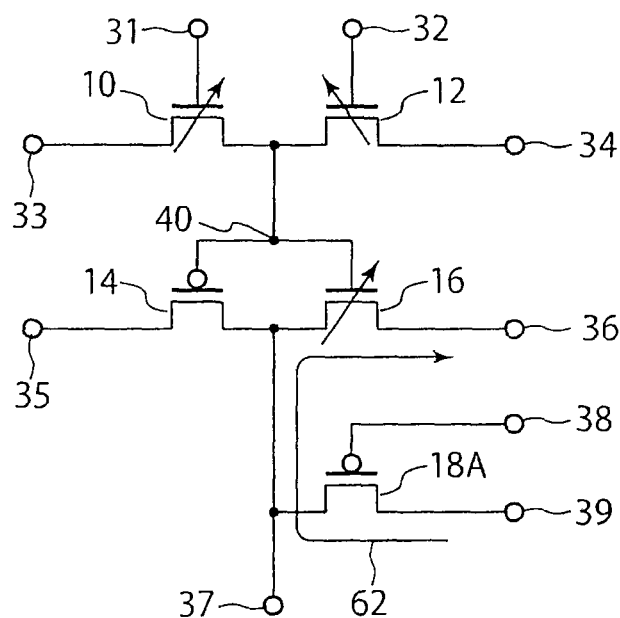
FIG. 23 is a circuit diagram showing a memory circuit according to a second modification of the second embodiment.

A memory circuit according to a second modification of the second embodiment is shown in FIG. 23. A memory circuit 2B according to the second modification has a configuration obtained by replacing the n-channel MOSFET 18 with a p-channel spin MOSFET 18A in the memory circuit 2 of the second embodiment shown in FIG. 20.

In the second modification, operation at the time of reading memory is performed in the same way as the second embodiment, except that the p-channel MOSFET 18A is brought to the off-state by applying a high voltage to the terminal 38. Hereafter, a method for performing writing into the spin MOSFET 16 in the second modification will be described. First, the voltage V1 at the terminal 40 is set to the high voltage to set the spin MOSFET 16 to the on-state by applying a high voltage to the terminal 31, a low voltage to the terminal 32 and a high voltage to the terminal 33. Or the voltage V1 at the terminal 40 can be set to the high voltage to set the spin MOSFET 16 to the on-state by applying a low voltage to the terminal 31, a high voltage to the terminal 32 and a high voltage to the terminal 34.

Furthermore, a low voltage is applied to the terminal 38 to set the MOSFET 18A to the on-state. In addition, a positive current is flowed through a current path 62 by applying a high voltage, which is nearly equal to or higher than the power supply voltage Vdd, to the terminal 39 and applying a low voltage, which is equal to the reference voltage GND or less, to the terminal 36. Or a negative current is flowed through the current path 62 by applying a low voltage, which is equal to the reference voltage GND or less, to the terminal 39 and applying a high voltage, which is nearly equal to or higher than the power supply voltage Vdd, to the terminal 36. As a result, a current which is large in absolute value flows through the current path 62 between the terminal 39 and the terminal 36.

The magnetization fixed layer and the magnetization free layer in the spin MOSFET 16 are disposed to set the spin MOSFET 16 to the high resistance state by flowing the positive current through the current path 62, and to set the spin MOSFET 16 to the low resistance state by flowing the negative current through the current path 62. Or the magnetization fixed layer and the magnetization free layer in the spin MOSFET 16 are disposed to set the spin MOSFET 16 to the low resistance state by flowing the positive current through the current path 62, and to set the spin MOSFET 16 to the high resistance state by flowing the negative current through the current path 62.

Also in the second modification, effects similar to those of the second embodiment can be obtained.

(Third Modification)

Figure 24:
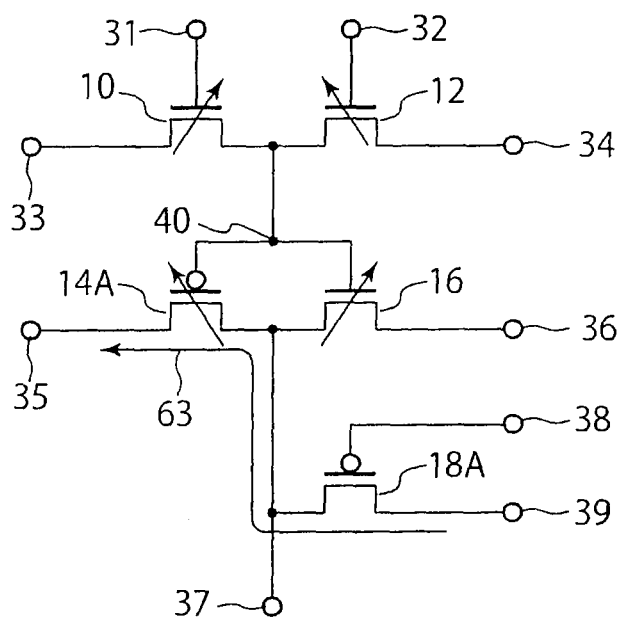
FIG. 24 is a circuit diagram showing a memory circuit according to a third modification of the second embodiment.

A memory circuit according to a third modification of the second embodiment is shown in FIG. 24. A memory circuit 2C according to the third modification has a configuration obtained by replacing the p-channel MOSFET 14 with the p-channel spin MOSFET 14A and replacing the n-channel MOSFET 18 with the p-channel MOSFET 18A in the memory circuit 2 of to the second embodiment shown in FIG. 20.

In the third modification, writing into the p-channel spin MOSFET 14A is performed by flowing a current through a current path 63 shown in FIG. 24. Hereafter, the writing method will be described. First, the voltage V1 at the terminal 40 is set to the low voltage to set the spin MOSFET 14A to the on-state by applying a high voltage to the terminal 31, a low voltage to the terminal 32 and a low voltage to the terminal 33. Or the voltage V1 at the terminal 40 can be set to the low voltage to set the spin MOSFET 14A to the on-state by applying a low voltage to the terminal 31, a high voltage to the terminal 32 and a low voltage to the terminal 34.

Furthermore, a low voltage is applied to the terminal 38 to set the p-channel MOSFET 18A to the on-state. In addition, a positive current is flowed through the current path 63 by applying a high voltage, which is nearly equal to or higher than the power supply voltage Vdd, to the terminal 39 and applying a low voltage, which is equal to the reference voltage GND or less, to the terminal 35. Or a negative current is flowed through the current path 63 by applying a low voltage, which is equal to the reference voltage GND or less, to the terminal 39 and applying a high voltage, which is nearly equal to or higher than the power supply voltage Vdd, to the terminal 35. As a result, a current which is large in absolute value flows through the current path 63 between the terminal 39 and the terminal 35.

The magnetization fixed layer and the magnetization free layer in the spin MOSFET 14A are disposed to set the spin MOSFET 14A to the low resistance state by flowing the positive current through the current path 63, and to set the spin MOSFET 14A to the high resistance state by flowing the negative current through the current path 63. Or the magnetization fixed layer and the magnetization free layer in the spin MOSFET 14A can be disposed to set the spin MOSFET 14A to the high resistance state by flowing the positive current through the current path 63, and to set the spin MOSFET 14A to the low resistance state by flowing the negative current through the current path 63.

Also in the third modification, effects similar to those of the second embodiment can be obtained as described heretofore.

(Third Embodiment)

Figure 25:
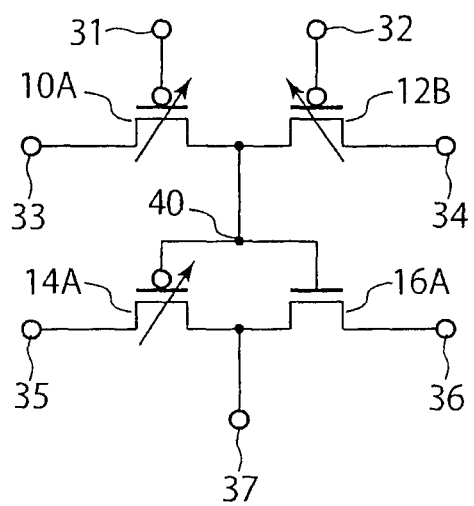
FIG. 25 is a circuit diagram showing a memory circuit according to a third embodiment.

A memory circuit according to a third embodiment is shown in FIG. 25. A memory circuit 3 according to the third embodiment has a configuration obtained by replacing the n-channel spin MOSFETs 10 and 12 respectively with p-channel spin MOSFETs 10A and 12B, replacing the p-channel MOSFET 14 with the p-channel spin MOSFET 14A, and replacing the n-channel MOSFET 16 with an n-channel MOSFET 16A in the memory circuit 1 of the first embodiment shown in FIG. 2. In the third embodiment, the spin MOSFET 10A and the spin MOSFET 14A are set to have the same resistance state, and the spin MOSFET 12B is set to have a resistance state which is different from that of the spin MOSFET 10A.

(Reading Method)

Figure 26:
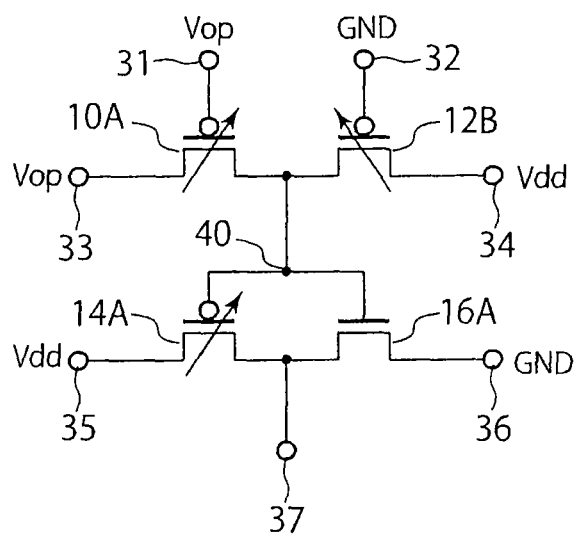
FIG. 26 is a diagram showing voltages applied to respective terminals in the memory circuit according to the third embodiment.

Voltages at respective terminals at the time of reading are shown in FIG. 26. In other words, the power supply voltage Vdd is applied to the terminals 32, 34 and 35, and the operation voltage Vop is applied to the terminals 31 and 33. The operation voltage Vop is set equal to a voltage as low as half of the power supply voltage, i.e. Vdd/2, or below. The reference voltage GND is applied to the terminal 36. The reference voltage GND is applied to a p-well terminal connected to a p-well in which the MOSFET 16A is provided. The power supply voltage Vdd is applied to n-well terminals connected to n-wells in which the spin MOSFETs 10A, 12B and 14A are provided respectively. At the time of reading, therefore, the spin MOSFETs 10A and 12B are set to the off-state, and only a very slight current flows. With low power consumption, therefore, a voltage difference depending upon the resistance states of the spin MOSFETs can be obtained at the output.

Figure 27:
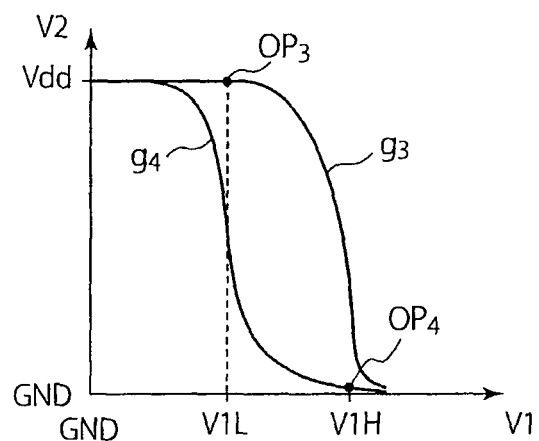
FIG. 27 is a diagram showing voltage characteristics of the memory circuit according to the third embodiment.

First, the case where the spin MOSFET 10A and the spin MOSFET 14A are in the low resistance state and the spin MOSFET 12B is in the high resistance state will be described. In this case, the voltage V1 at the node 40 is a low voltage V1L. Furthermore, input-output characteristics of the inverter circuit formed of the spin MOSFET 14A and the MOSFET 16A are shown in a graph $g_3$ in FIG. 27. Since the input voltage V1 in this case is the low voltage V1L, the input voltage V1 and the output voltage V2 assume an operating point $OP_3$ shown in FIG. 27. And the output voltage V2 assumes a value close to the power supply voltage Vdd.

Then, the case where the spin MOSFET 10A and the spin MOSFET 14A are in the high resistance state and the spin MOSFET 12B is in the low resistance state will be described. In this case, the voltage V1 at the node 40 is a high voltage V1H. And input-output characteristics of the inverter circuit formed of the spin MOSFET 14A and the spin MOSFET 16A is shown in a graph $g_4$ in FIG. 27. Since the input voltage V1 in this case is the high voltage V1H, the input voltage V1 and the output voltage V2 assume an operating point $OP_4$ shown in FIG. 27. And the output voltage V2 assumes a value close to the reference voltage GND.

In this way, the output voltage V2 can be stabilized to either the value close to the reference voltage GND or the value close to the power supply voltage Vdd by using the inverter circuit formed of the spin MOSFET 14A and the MOSFET 16A.

In the third embodiment, it is possible to obtain a stable bi-valued output depending upon the resistance states of the spin MOSFETs 10A, 12B and 14A. As a result, a nonvolatile memory can be implemented.

(Writing Method)

A writing method in the memory circuit 3 according to the third embodiment will be described. In the third embodiment, writing into the spin MOSFET is performed by using the spin torque transfer switching. In the spin torque transfer switching, it is possible to switch magnetization in the magnetization free layer in the spin MOSFET and to change the resistance state by flowing a current, which is equal to or greater than the inversion current, between the source and drain.

Figure 28:
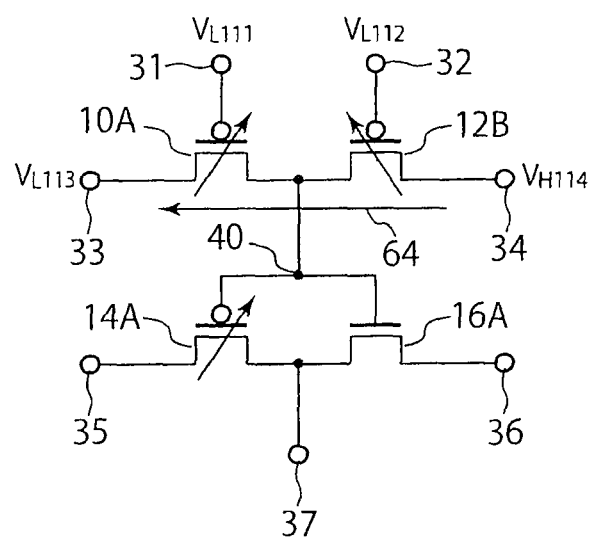
FIG. 28 is a diagram for explaining a writing method in the memory circuit according to the third embodiment.
Figure 29:
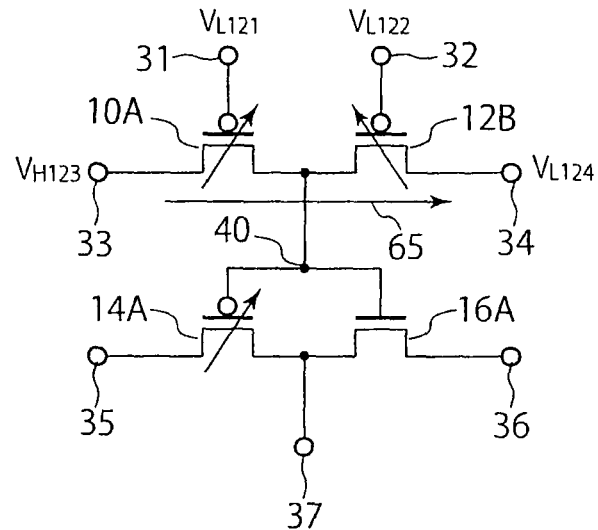
FIG. 29 is a diagram for explaining a writing method in the memory circuit according to the third embodiment.

Writing into the spin MOSFET 10A and the spin MOSFET 12B is performed by flowing a current through a current path 64 shown in FIG. 28 and a current path 65 shown in FIG. 29.

First, the case where a current is flowed through the current path 64 as shown in FIG. 28 will be described. The spin MOSFET 10A and the spin MOSFET 12B are set to the on-state by applying a low voltage VL111 to the terminal 31 and applying a low voltage VL112 to the terminal 32. A large current is flowed from the terminal 34 to the terminal 33 by applying a low voltage VL113, which is equal to the reference voltage GND or less, to the terminal 33 and applying a high voltage VH114, which is nearly equal to or higher than the power supply voltage Vdd, to the terminal 34. In this case, magnetizations in the magnetization fixed layer and the magnetization free layer in the spin MOSFET 10A and the spin MOSFET 12B are disposed to bring the spin MOSFET 10A to the low resistance state, and to set the spin MOSFET 12B to the high resistance state.

Then, the case where a current is flowed through the current path 65 as shown in FIG. 29 will be described. The spin MOSFET 10A and the spin MOSFET 12B are brought to the on-state by applying a low voltage VL121 to the terminal 31 and applying a low voltage VL122 to the terminal 32. A large current is flowed from the terminal 33 to the terminal 34 by applying a high voltage VH123, which is nearly equal to or higher than the power supply voltage Vdd, to the terminal 33 and applying a low voltage VL124, which is equal to the reference voltage GND or less, to the terminal 34. Magnetizations in the magnetization fixed layer and the magnetization free layer in the spin MOSFET 10A and the spin MOSFET 12B are disposed to set the spin MOSFET 10A to the high resistance state, and to set the spin MOSFET 1.2B to the low resistance state.

The magnetization fixed layer and the magnetization free layer in the spin MOSFET 10A and the spin MOSFET 12B can be disposed to set the spin MOSFET 10A to the high resistance state and the spin MOSFET 12B to the low resistance state by flowing a large current through the current path 64, and to set the spin MOSFET 10A to the low resistance state and the spin MOSFET 12B to the high resistance state by flowing a large current through the current path 65.

Figure 30:
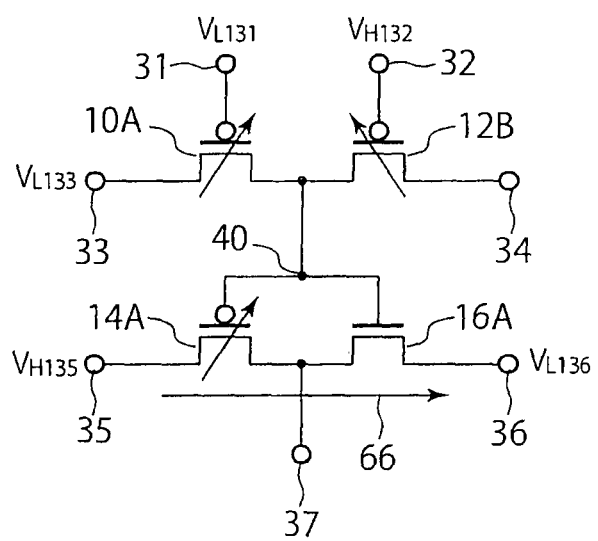
FIG. 30 is a diagram for explaining a writing method in the memory circuit according to the third embodiment.
Figure 31:
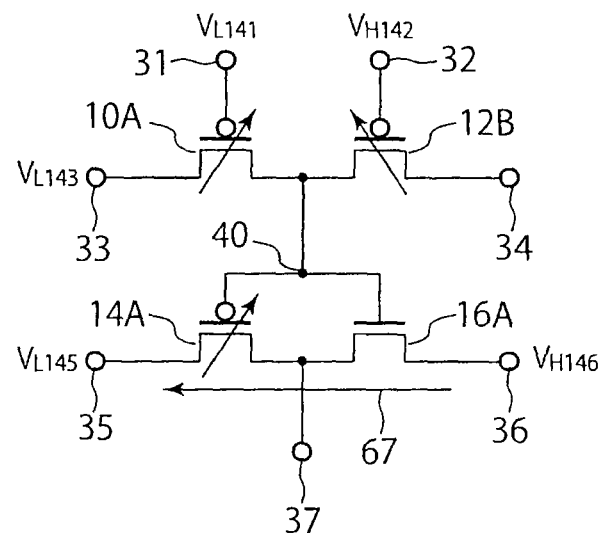
FIG. 31 is a diagram for explaining a writing method in the memory circuit according to the third embodiment.

Writing into the spin MOSFET 14A is performed by flowing a current through a current path 66 shown in FIG. 30 and a current path 67 shown in FIG. 31.

First, the case where a current is flowed through the current path 66 as shown in FIG. 30 will be described. The spin MOSFET 10A is set to the on-state and the spin MOSFET 12B is set to the off-state by applying a low voltage VL131 to the terminal 31 and applying a high voltage VH132 to the terminal 32. A high voltage VH135, which is nearly equal to or higher than the power supply voltage Vdd, is applied to the terminal 35, and a low voltage VL136, which is equal to the reference voltage GND or less, is applied to the terminal 36. Denoting a threshold voltage of the spin MOSFET 14A by Vth3 and denoting a threshold voltage of the MOSFET 16A by Vth4, a low voltage VL133 is applied to the terminal 33 which is connected to one of the source/drain of the spin MOSFET 10A to cause the voltage V1 at the terminal 40 to satisfy the following relation.

$$VL136+Vth4 < V1 < VH135-Vth3$$

As a result, a large current flows through the current path 66 between the terminal 35 and the terminal 36. Magnetizations in the magnetization fixed layer and the magnetization free layer in the spin MOSFET 14A are disposed to bring the spin MOSFET 14A to a low resistance state by flowing a large current through the current path 66.

Then, the case where a current is flowed through the current path 67 as shown in FIG. 31 will be described. The spin MOSFET 10A is set to the on-state and the spin MOSFET 12B is set to the off-state by applying a low voltage VL141 to the terminal 31 and applying a high voltage VH142 to the terminal 32. A high voltage VH146, which is nearly equal to or higher than the power supply voltage Vdd, is applied to the terminal 36 and a low voltage VL145, which is equal to the reference voltage GND or less, is applied to the terminal 35. Denoting a threshold voltage of the spin MOSFET 14A by Vth3 and denoting a threshold voltage of the MOSFET 16A by Vth4, a low voltage L143 is applied to cause the voltage V1 at the terminal 40 to satisfy the following relation.

$$VL145+Vth3 < V1 < VH146-Vth4$$

As a result, a large current flows through the current path 67 between the terminal 36 to the terminal 35. Magnetizations in the magnetization fixed layer and the magnetization free layer in the spin MOSFET 14A are disposed to set the spin MOSFET 14A to a high resistance state by flowing a large current through the current path 67.

The magnetization fixed layer and the magnetization free layer in the spin MOSFET 14A may be disposed to bring the spin MOSFET 14A to the high resistance state by flowing a large current through the current path 66, and to set the spin MOSFET 14A to the low resistance state by flowing a large current through the current path 67.

As described heretofore, it is possible according to the third embodiment to constitute a memory circuit by using four transistors, i.e., three spin MOSFETs and one MOSFET. Therefore, a memory circuit having a small area can be obtained.

As for the memory circuit according to the third embodiment, a memory circuit having a small area can be implemented. Therefore, not only higher integration becomes possible in the LSI, but also a fast circuit can be implemented because of a shorter interconnection delay in the logic circuit.

In the third embodiment, the spin MOSFET uses a scheme in which magnetization of a ferromagnetic material in the spin MOSFET is switched by flowing a write current from one of the source/drain to the other, i.e., the spin torque transfer switching scheme. Alternatively, it is also possible to dispose a wiring in a position near a spin MOSFET, flow a current through this wiring, and switch magnetization in a ferromagnetic material in the spin MOSFET by means of a magnetic field induced by a current flowing through the interconnection.

The spin MOSFET used in the third embodiment is nonvolatile. Even if the power supply is turned off, therefore, the resistance state is maintained. When the memory circuit according to the third embodiment is not used, therefore, it is possible to turn off the power supply and the power consumption can be lowered. Furthermore, even if the power supply is suddenly turned off, memory information is maintained and consequently a memory for backup becomes unnecessary. As a result, the whole system can be made small.

In the third embodiment, the spin MOSFET is used as the nonvolatile memory. As a result, a memory circuit having tolerance for rewriting can be implemented.

Furthermore, according to the third embodiment, it is possible to make the variation in electric characteristics very small by fabricating spin MOSFETs in the same process. As a result, a nonvolatile memory circuit having a high yield can be obtained.

(First Modification)

Figure 32:
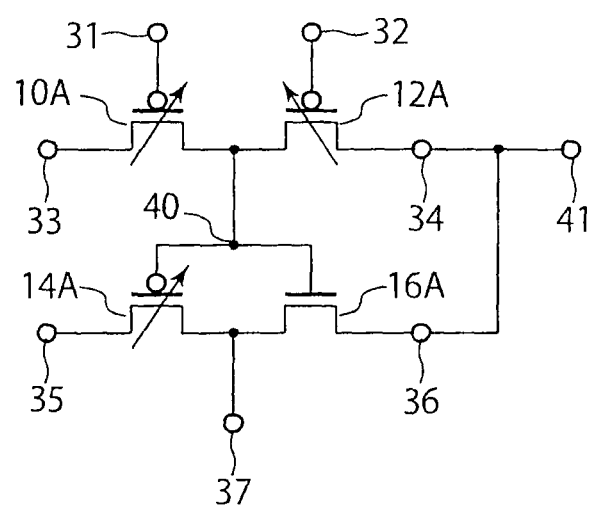
FIG. 32 is a circuit diagram showing a memory circuit according to a first modification of the third embodiment.

A memory circuit according to a first modification of the third embodiment is shown in FIG. 32. A memory circuit 3A according to the first modification has a configuration obtained by interconnecting the terminal 34 and the terminal 36 to form a terminal 41 in the memory circuit 3 of the third embodiment shown in FIG. 25. The memory circuit 3A according to the first modification is more desirable because the number of terminals is reduced as compared with the memory circuit 3 according to the third embodiment shown in FIG. 25.

Also in the first modification, a memory circuit which has a high speed, nonvolatility and low power consumption can be obtained in the same way as the third embodiment.

(Second Modification)

Figure 33:
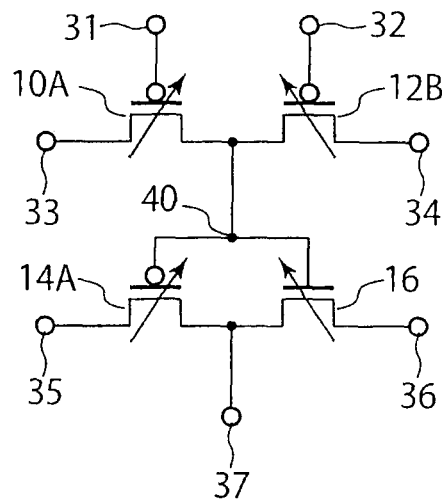
FIG. 33 is a circuit diagram showing a memory circuit according to a second modification of the third embodiment.

A memory circuit according to a second modification of the third embodiment is shown in FIG. 33. A memory circuit 3B according to the second modification has a configuration obtained by replacing the n-channel MOSFET 16A with the n-channel spin MOSFET 16 in the memory circuit 3 of the third embodiment shown in FIG. 25. In this case, one of the p-channel spin MOSFET 14A and the n-channel spin MOSFET 16 is in a high resistance state, whereas the other is set to a low resistance state. Furthermore, an inverter circuit formed of the spin MOSFET 14A and the spin MOSFET 16 is set to cause an operating point to have a value which is stably close to Vdd or GND depending upon characteristics of the spin MOSFET 14A and the spin MOSFET 16.

And in the second modification, voltages applied to respective terminals at the time of reading are the same as those in the case of the third embodiment.

In the second modification, writing into the spin MOSFET 16 can be performed nearly simultaneously in accordance with a procedure for writing data into the spin MOSFET 14A.

In the case where the n-channel spin MOSFET 16 is used, there is a desirable advantage that the power consumption of the inverter circuit formed of the spin MOSFETs 14A and 16 becomes stably low.

Also in the second modification, a memory circuit which has a high sped, nonvolatility, and low power consumption can be obtained in the same way as the third embodiment.

(Third Modification)

Figure 34:
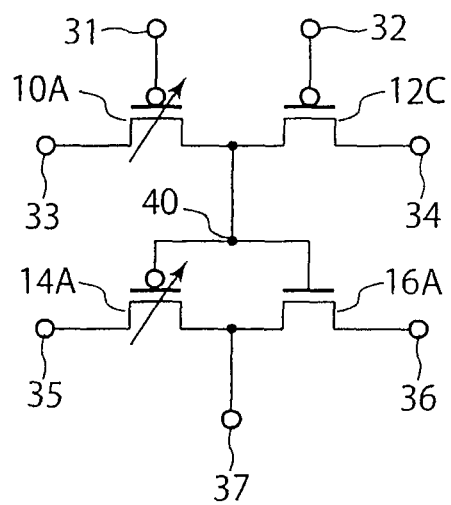
FIG. 34 is a circuit diagram showing a memory circuit according to a third modification of the third embodiment.

A memory circuit according to a third modification of the third embodiment is shown in FIG. 34. A memory circuit 3C according to the third modification has a configuration obtained by replacing the p-channel spin MOSFET 12B with a p-channel MOSFET 12C in the memory circuit 3C of the third embodiment shown in FIG. 25. In the third modification, voltages applied to respective terminals at the time of reading are the same as those in the case of the third embodiment.

Also in the third modification, a memory circuit which has a high speed, nonvolatility, and low power consumption can be obtained in the same way as the third embodiment.

(Fourth Modification)

Figure 35:
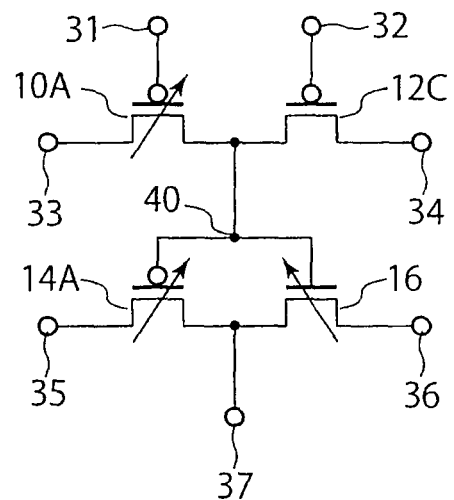
FIG. 35 is a circuit diagram showing a memory circuit according to a fourth modification of the third embodiment.

A memory circuit according to a fourth modification of the third embodiment is shown in FIG. 35. A memory circuit 3D according to the fourth modification has a configuration obtained by replacing the p-channel spin MOSFET 12B with the p-channel MOSFET 12C in the memory circuit 3B of the second modification shown in FIG. 33. In the fourth modification, voltages applied to respective terminals at the time of reading are the same as those in the case of the second modification.

Also in the fourth modification, a memory circuit which has a high speed, nonvolatility, and low power consumption can be obtained in the same way as the second modification.

(Fifth Modification)

Figure 36:
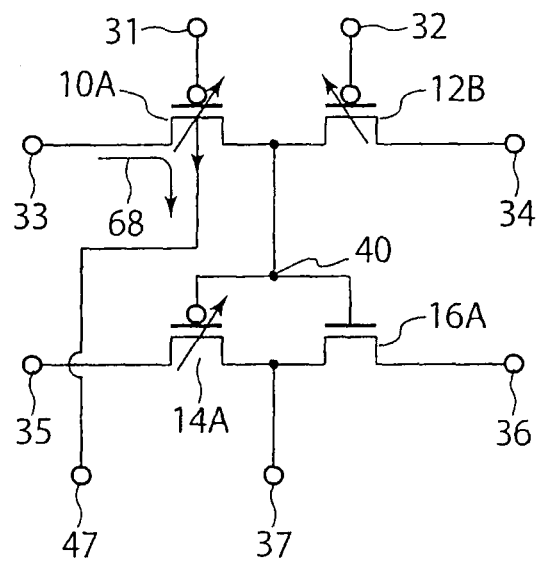
FIG. 36 is a diagram for explaining a writing method in the memory circuit according to a fifth modification of the third embodiment.

A memory circuit according to a fifth modification of the third embodiment will be described with reference to FIG. 36. A memory circuit 3E according to the fifth modification has a configuration obtained by changing the writing method for the spin MOSFET 10A in the memory circuit 3 of the third embodiment shown in FIG. 25. The memory circuit 3E has a configuration which flows a write current through a current path 68 and inverts the magnetization in the magnetization free layer in the spin MOSFET 10A by applying a low voltage to an n-well terminal 47 connected to an n-well in which the spin MOSFET 10A is provided and applying a high voltage to the terminal 33 as shown in FIG. 36.

(Sixth Modification)

Figure 37:
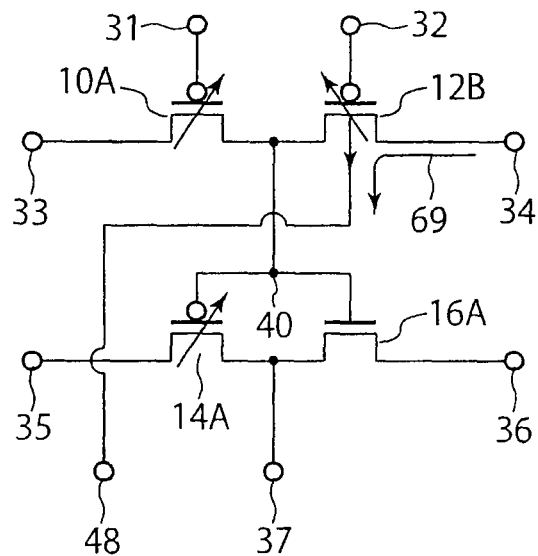
FIG. 37 is a diagram for explaining a writing method in the memory circuit according to a sixth modification of the third embodiment.

A memory circuit according to a sixth modification of the third embodiment will be described with reference to FIG. 37. A memory circuit 3F according to the sixth modification has a configuration obtained by changing the writing method for the spin MOSFET 12B in the memory circuit 3 of the third embodiment shown in FIG. 25. The memory circuit 3F has a configuration which flows a write current through a current path 69 and inverts the magnetization in the magnetization free layer in the spin MOSFET 12B by applying a low voltage to an n-well terminal 48 connected to an n-well in which the spin MOSFET 12B is provided and applying a high voltage to the terminal 34 as shown in FIG. 37.

(Seventh Modification)

Figure 38:
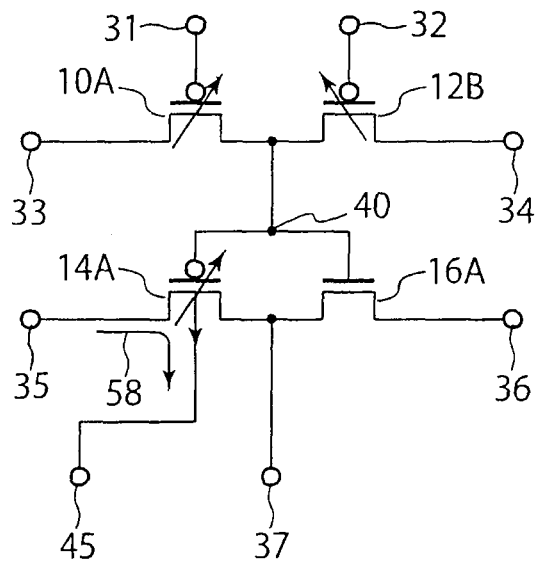
FIG. 38 is a diagram for explaining a writing method in the memory circuit according to a seventh modification of the third embodiment.

A memory circuit according to a seventh modification of the third embodiment will be described with reference to FIG. 38. A memory circuit 3G according to the seventh modification has a configuration obtained by changing the writing method for the spin MOSFET 14A in the memory circuit 3 of the third embodiment shown in FIG. 25. The memory circuit 3G has a configuration which flows a write current through the current path 58 and inverts the magnetization in the magnetization free layer in the spin MOSFET 14A by applying a low voltage to an n-well terminal 45 connected to an n-well in which the spin MOSFET 14A is provided and applying a high voltage to the terminal 35 as shown in FIG. 38.

(Eighth Modification)

Figure 39:
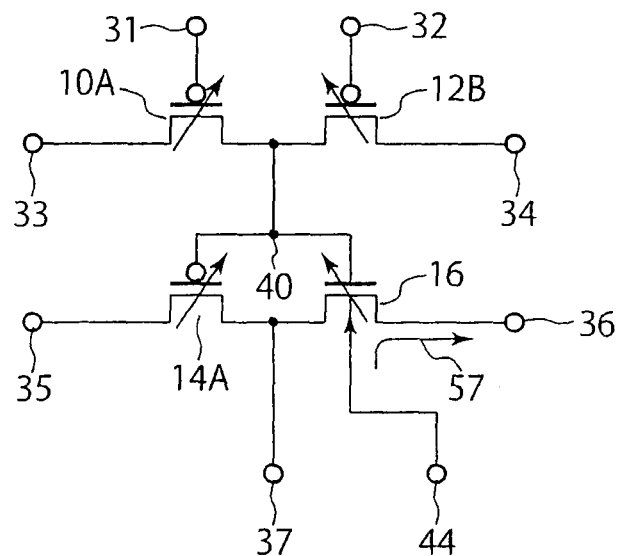
FIG. 39 is a diagram for explaining a writing method in the memory circuit according to an eighth modification of the third embodiment.

A memory circuit according to an eighth modification of the third embodiment will be described with reference to FIG. 39. A memory circuit 3H according to the eighth modification has a configuration obtained by changing the writing method for the n-channel spin MOSFET 16 in the memory circuit 3B of the second modification of the third embodiment shown in FIG. 33. The memory circuit 3H has a configuration which flows a write current through the current path 57 and switches the magnetization in the magnetization free layer in the spin MOSFET 16 by applying a low voltage to a p-well terminal 44 connected to a p-well in which the n-channel spin MOSFET 16 is provided and applying a high voltage to the terminal 36 as shown in FIG. 39.

(Ninth Modification)

Figure 40:
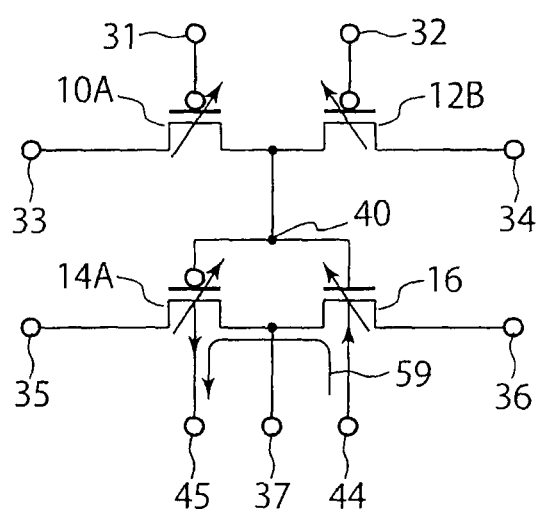
FIG. 40 is a diagram for explaining a writing method in the memory circuit according to a ninth modification of the third embodiment.

A memory circuit according to a ninth modification of the third embodiment will be described with reference to FIG. 40. A memory circuit 3I according to the ninth modification has a configuration obtained by changing the writing method for the p-channel spin MOSFET 14A and the n-channel spin MOSFET 16 in the memory circuit 3B of the second modification shown in FIG. 33. The memory circuit 3I has a configuration which flows a write current through the current path 59 and switches the magnetization in the magnetization free layer in at least one of the p-channel spin MOSFET 14A and the n-channel spin MOSFET 16 by applying a low voltage to the n-well terminal 45 connected to the n-well in which the p-channel spin MOSFET 14A is provided and applying a high voltage to the p-well terminal 44 connected to the p-well in which the n-channel spin MOSFET 16 is provided as shown in FIG. 40.

(Fourth Embodiment)

A memory circuit according to a fourth embodiment will be described with reference to FIGS. 41 and 42.

Figure 41:
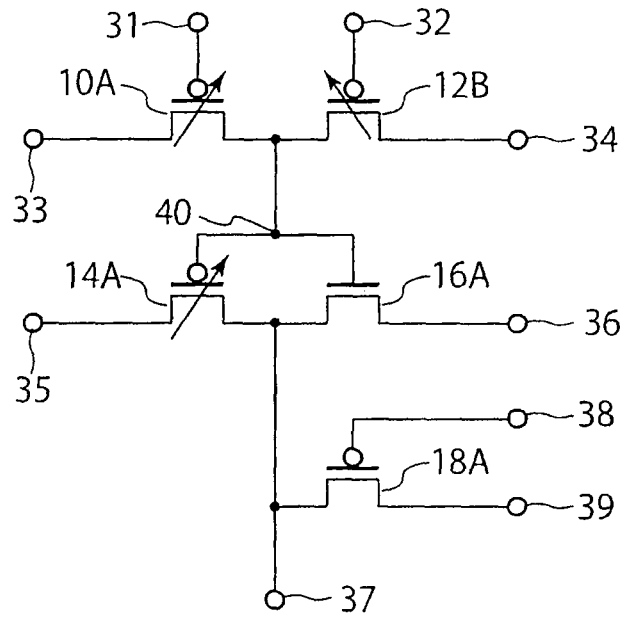
FIG. 41 is a circuit diagram showing a memory circuit according to a fourth embodiment.

The memory circuit according to the fourth embodiment is shown in FIG. 41. A memory circuit 4 according to the fourth embodiment has a configuration obtained by newly providing a p-channel MOSFET 18A connected at one of its source/drain electrode to the terminal 37, connected at the other of its source/drain electrode to the terminal 39, and connected at its gate to the terminal 38 in the memory circuit 3 according to the third embodiment shown in FIG. 25. The MOSFET 18A is provided to perform writing into the p-channel spin MOSFET 14A.

In the fourth embodiment, at the time of memory reading, a high voltage is applied to the terminal 38 to bring the MOSFET 18A to the off-state.

Figure 42:
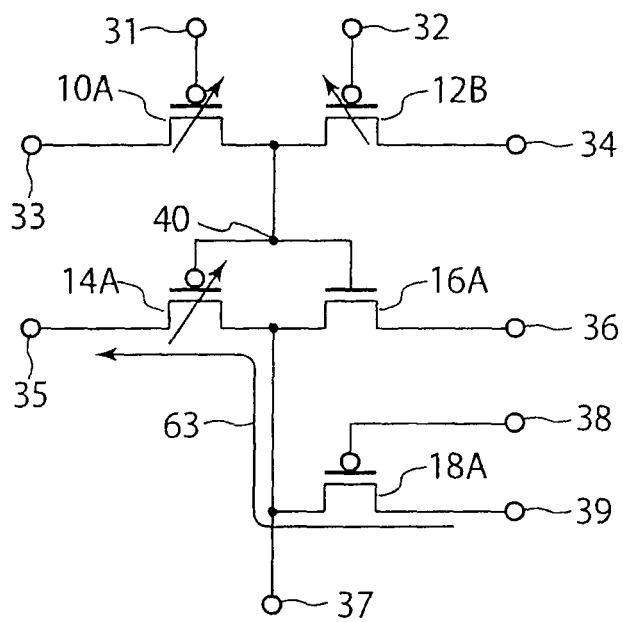
FIG. 42 is a diagram for explaining a writing method in the memory circuit according to the third embodiment.

Writing into the p-channel spin MOSFET 14A is performed by flowing a current through the current path 63 shown in FIG. 42. In other words, the voltage V1 at the terminal 40 is set to the low voltage to set the spin MOSFET 14A to the on-state by applying a low voltage to the terminal 31, a high voltage to the terminal 32 and a low voltage to the terminal 33. The voltage V1 at the terminal 40 can be set to the low voltage to set the spin MOSFET 14A to the on-state by applying a high voltage to the terminal 31, a low voltage to the terminal 32 and a low voltage to the terminal 34.

And a low voltage is applied to the terminal 38 to set the MOSFET 18A to the on-state. In addition, a positive current is flowed through the current path 63 by applying a high voltage, which is nearly equal to or higher than the power supply voltage Vdd, to the terminal 39 and applying a low voltage, which is equal to the reference voltage GND or less, to the terminal 35. Or a negative current is flowed through the current path 63 by applying a high voltage, which is nearly equal to or higher than the power supply voltage Vdd, to the terminal 35 and applying a low voltage, which is equal to the reference voltage GND or less, to the terminal 39.

As a result, a current which is large in absolute value flows through the current path 63 between the terminal 39 and the terminal 35. The magnetization fixed layer and the magnetization free layer in the spin MOSFET 14A are disposed to bring the spin MOSFET 14A to the low resistance state by flowing the positive current through the current path 63, and to set the spin MOSFET 14A to the high resistance state by flowing the negative current through the current path 63. The magnetization fixed layer and the magnetization free layer in the spin MOSFET 14A can be disposed to set the spin MOSFET 14A to the high resistance state by flowing the positive current through the current path 63, and to set the spin MOSFET 14A to the low resistance state by flowing the negative current through the current path 63.

According to the fourth embodiment, the memory circuit can be implemented by using three spin MOSFETs and two MOSFETs, i.e., a total of five transistors, as described heretofore. As a result, a memory circuit having a small area can be implemented.

Also in the fourth embodiment, a memory circuit which has a high speed, nonvolatility, and low power consumption can be obtained in the same way as the third embodiment.

In addition, according to the fourth embodiment, the spin MOSFET is used as the nonvolatile memory. As a result, a memory circuit having tolerance for rewriting can be implemented.

Furthermore, according to the fourth embodiment, it is possible to make the variation in electric characteristics very small by fabricating spin MOSFETs in the same process. As a result, a nonvolatile memory circuit having a high yield can be obtained.

(First Modification)

Figure 43:
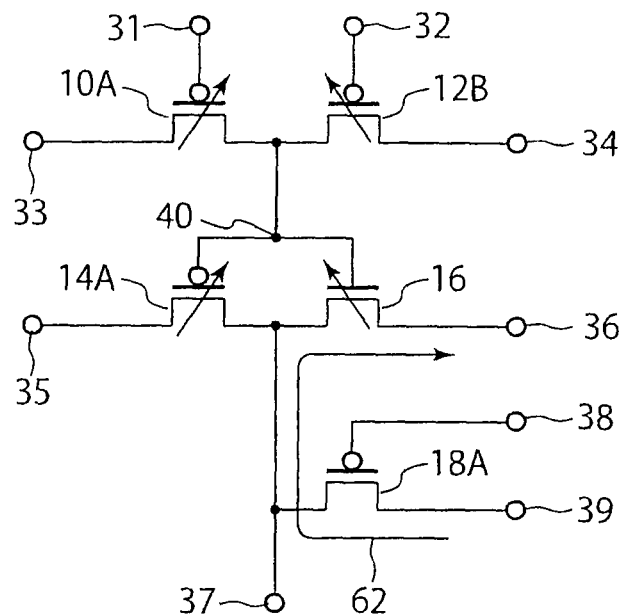
FIG. 43 is a diagram for explaining a writing method in the memory circuit according to a first modification of the fourth embodiment.

A memory circuit according to a first modification of the fourth embodiment is shown in FIG. 43. A memory circuit 4A according to the first modification has a configuration obtained by replacing the n-channel MOSFET 16A with the n-channel spin MOSFET 16 in the memory circuit 4 of the fourth embodiment shown in FIG. 41.

In the first modification, writing into the n-channel spin MOSFET 16 is performed by flowing a current through the current path 62 shown in FIG. 43. In other words, the voltage V1 at the terminal 40 is set to the high voltage to set the spin MOSFET 16 to the on-state by applying a low voltage to the terminal 31, a high voltage to the terminal 32 and a high voltage to the terminal 33. Or the voltage V1 at the terminal 40 can be set to the high voltage to set the spin MOSFET 16 to the on-state by applying a high voltage to the terminal 31, a low voltage to the terminal 32 and a high voltage to the terminal 34. And a low voltage is applied to the terminal 38 to set the MOSFET 18A to the on-state. In addition, a positive current is flowed through the current path 62 by applying a high voltage, which is nearly equal to or higher than the power supply voltage Vdd, to the terminal 39 and applying a low voltage, which is equal to the reference voltage GND or less, to the terminal 36. Or a negative current is flowed through the current path 62 by applying a low voltage, which is equal to the reference voltage GND or less, to the terminal 39 and applying a high voltage, which is nearly equal to or higher than the power supply voltage Vdd, to the terminal 36. As a result, a current which is large in absolute value flows through the current path 62 between the terminal 39 and the terminal 36. The magnetization fixed layer and the magnetization free layer in the spin MOSFET 16 are disposed to set the spin MOSFET 16 to the high resistance state by flowing the positive current through the current path 62, and to set the spin MOSFET 16 to the low resistance state by flowing the negative current through the current path 62. Or the magnetization fixed layer and the magnetization free layer in the spin MOSFET 16 can be disposed to set the spin MOSFET 16 to the low resistance state by flowing the positive current through the current path 62, and to set the spin MOSFET 16 to the high resistance state by flowing the negative current through the current path 62.

Also in the first modification, effects similar to those of the fourth embodiment can be obtained.

(Second Modification)

Figure 44:
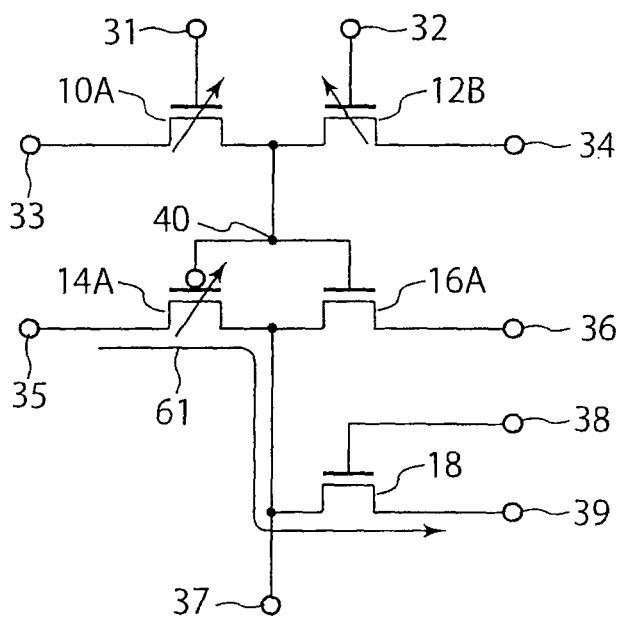
FIG. 44 is a diagram for explaining a writing method in the memory circuit according to a second modification of the fourth embodiment.

A memory circuit according to a second modification of the fourth embodiment is shown in FIG. 44. A memory circuit 4B according to the second modification has a configuration obtained by replacing the p-channel MOSFET 18A with the n-channel spin MOSFET 18 in the memory circuit 4 of the fourth embodiment shown in FIG. 41.

In the second modification, at the time of reading, a low voltage is applied to the terminal 38 to bring the MOSFET 18 to the off-state.

In the memory circuit according to the second modification, writing into the spin MOSFET 14A is performed by flowing a current through the current path 61 shown in FIG. 44. In other words, the voltage V1 at the terminal 40 is set to the low voltage to set the spin MOSFET 14A to the on-state by applying a low voltage to the terminal 31, a high voltage to the terminal 32 and a low voltage to the terminal 33. Or the voltage V1 at the terminal 40 may be set to the low voltage to set the spin MOSFET 14A to the on-state by applying a high voltage to the terminal 31, a low voltage to the terminal 32 and a low voltage to the terminal 34. And a high voltage is applied to the terminal 38 to set the MOSFET 18 to the on-state. In addition, a positive current is flowed through the current path 61 by applying a high voltage, which is nearly equal to or higher than the power supply voltage Vdd, to the terminal 35 and applying a low voltage, which is equal to the reference voltage GND or less, to the terminal 39. Or a negative current is flowed through the current path 61 by applying a low voltage, which is equal to the reference voltage GND or less, to the terminal 35 and applying a high voltage, which is nearly equal to or higher than the power supply voltage Vdd, to the terminal 39. As a result, a current which is large in absolute value flows through the current path 61 between the terminal 39 and the terminal 35. The magnetization fixed layer and the magnetization free layer in the spin MOSFET are disposed to set the spin MOSFET 14A to the low resistance state by flowing the positive current through the current path 61, and to set the spin MOSFET 14A to the high resistance state by flowing the negative current through the current path 61. Or the magnetization fixed layer and the magnetization free layer in the spin MOSFET are disposed to set the spin MOSFET 14A to the high resistance state by flowing the positive current through the current path 61, and to set the spin MOSFET 14A to the low resistance state by flowing the negative current through the current path 61.

Also in the second modification, effects similar to those of the fourth embodiment can be obtained.

(Third Modification)

Figure 45:
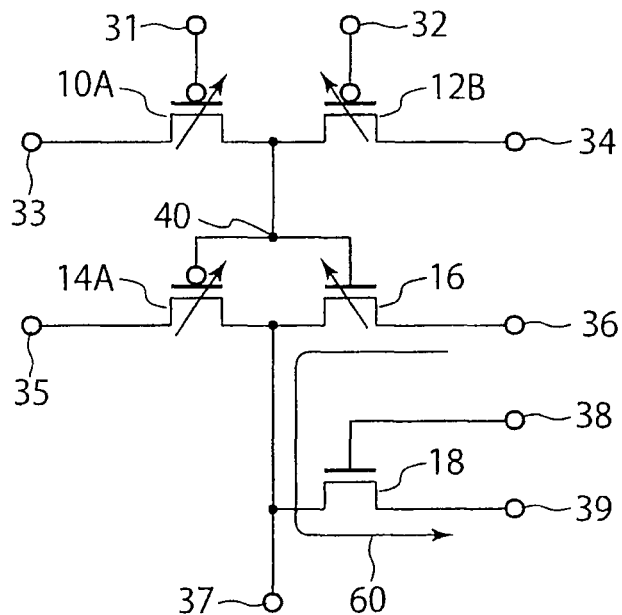
FIG. 45 is a diagram for explaining a writing method in the memory circuit according to a third modification of the fourth embodiment.

A memory circuit according to a third modification of the fourth embodiment is shown in FIG. 45. A memory circuit 4C according to the third modification has a configuration obtained by replacing the n-channel MOSFET 16A with the n-channel spin MOSFET 16 in the memory circuit 4B of the second modification of the fourth embodiment shown in FIG. 44.

In the third modification, writing into the spin MOSFET 16 is performed by flowing a current through the current path 60 shown in FIG. 45. In other words, the voltage V1 at the terminal 40 is set to the high voltage to bring the spin MOSFET 16 to the on-state by applying a low voltage to the terminal 31, a high voltage to the terminal 32 and a high voltage to the terminal 33. Or the voltage V1 at the terminal 40 may be set to the high voltage to set the spin MOSFET 16 to the on-state by applying a high voltage to the terminal 31, a low voltage to the terminal 32 and a high voltage to the terminal 34. And a high voltage is applied to the terminal 38 to bring the MOSFET 18 to the on-state. In addition, a positive current is flowed through the current path 60 by applying a high voltage, which is nearly equal to or higher than the power supply voltage Vdd, to the terminal 36 and applying a low voltage, which is equal to the reference voltage GND or less, to the terminal 39. Or a negative current is flowed through the current path 60 by applying a low voltage, which is equal to the reference voltage GND, to the terminal 36 and applying a high voltage, which is nearly equal to or higher than the power supply voltage Vdd, to the terminal 39. As a result, a current which is large in absolute value flows through the current path 60 between the terminal 36 and the terminal 39. The magnetization fixed layer and the magnetization free layer in the spin MOSFET 16 are disposed to set the spin MOSFET 16 to the high resistance state by flowing the positive current through the current path 60, and to set the spin MOSFET 16 to the low resistance state by flowing the negative current through the current path 60. Or the magnetization fixed layer and the magnetization free layer in the spin MOSFET 16 can be disposed to set the spin MOSFET 16 to the low resistance state by flowing the positive current through the current path 60, and to set the spin MOSFET 16 to the high resistance state by flowing the negative current through the current path 60.

Also in the third modification, effects similar to those of the fourth embodiment can be obtained.

(Fifth Embodiment)

Figure 46:
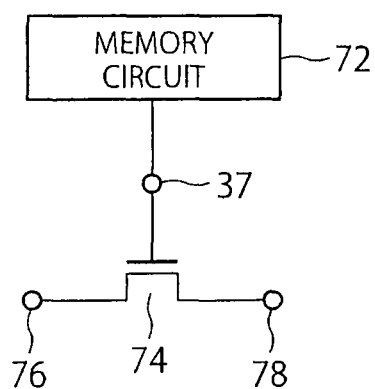
FIG. 46 is a circuit diagram showing a path transistor circuit with memory function according to a fifth embodiment.

A path transistor circuit with memory function according to a fifth embodiment is shown in FIG. 46. A path transistor circuit with memory function 70 according to the fifth embodiment includes a memory circuit 72 and a path transistor 74. The memory circuit 72 is one of the memory circuits according to the first to fourth embodiments and their modifications, and the memory circuit 72 has an output terminal 37. The output terminal 37 is the same as the terminal 37 of one of the memory circuits according to the first to fourth embodiments and their modifications. In the present embodiment, the path transistor 74 is an n-channel MOSFET. However, a p-channel MOSFET may be used. The path transistor 74 is connected at its gate to the output terminal 37 of the memory circuit 72, connected at one of its source/drain to a first input/output terminal 76, and connected at the other of the its source/drain to a second input/output terminal 78.

In the path transistor circuit with memory function 70 according to the fifth embodiment, it is possible to set a potential at the output terminal 37 of the memory circuit 72 to a high voltage or a low voltage depending upon the resistance states of the spin MOSFETs in the memory circuit 72. As a result, the state between the input/output terminal 76 and the input/output terminal 78 of the path transistor 74 can be set to a state of connection or disconnection.

According to the fifth embodiment, a path transistor circuit with memory function which has a small area, nonvolatility, and low power consumption can be obtained. If the path transistor circuit with memory function according to the fifth embodiment is used, therefore, a logic circuit which has a high sped, low dissipation, and is reconfigurable can be constituted. Furthermore, if the path transistor circuit with memory function according to the fifth embodiment is used, a field programmable gate array which has a high speed and low power consumption can be constituted. In addition, using the path transistor circuit with memory function according to the fifth embodiment, a logic circuit which has a high integration and low power consumption can be constituted. If the path transistor circuit with memory function according to the fifth embodiment is used, a fast logic circuit can be constituted because of decreased interconnection delays. Furthermore, if the path transistor circuit with memory function according to the fifth embodiment is used, a small system which does not need a backup memory can be constituted.

(Sixth Embodiment)

Figure 47:
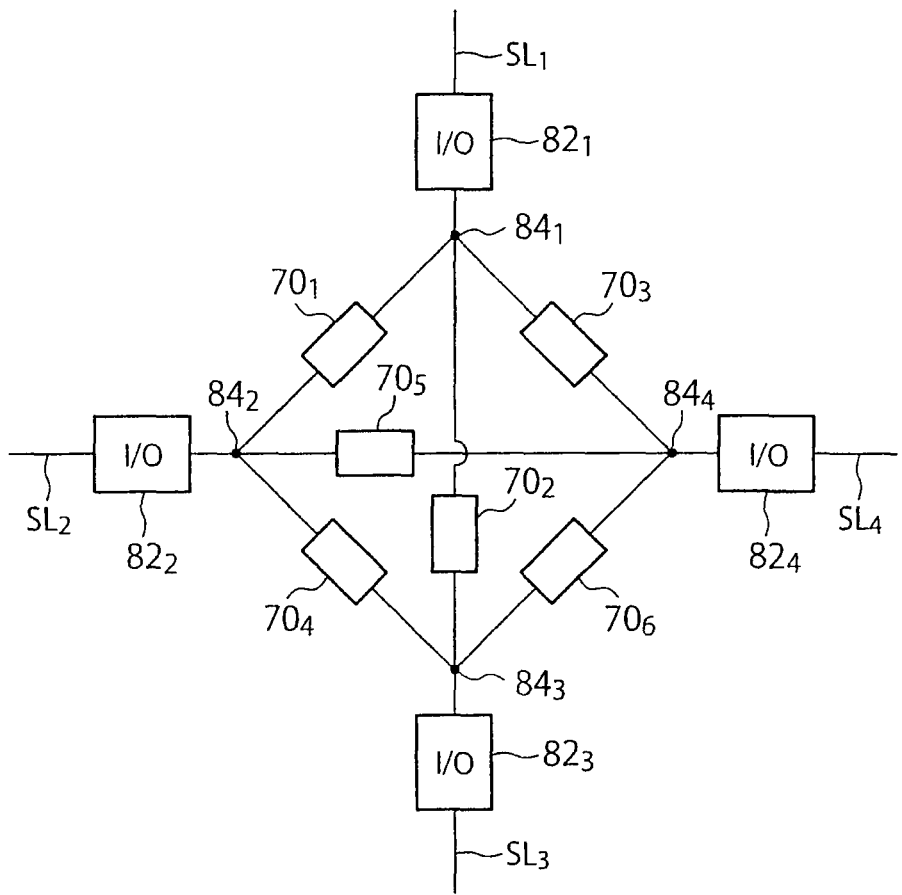
FIG. 47 is a circuit diagram showing a switching box circuit according to a sixth embodiment.

A switching box circuit according to a sixth embodiment is shown in FIG. 47. In general, a switching box circuit is a circuit which determines connection and disconnection in a region where signal lines from four directions meet one another. A switching box circuit 80 according to the sixth embodiment determines connection and disconnection of four signal lines $SL_1$, $SL_2$, $SL_3$ and $SL_4$. The switching box circuit 80 includes four input/output units $82_1$ to $82_4$, four connection nodes $84_1$ to $84_4$, and six path transistor circuits $70_1$ to $70_6$. Each of the path transistor circuits $70_1$ to $70_6$ has the same configuration as that of the path transistor circuit with memory function 70 in the fifth embodiment.

The four signal lines $SL_1$, $SL_2$, $SL_3$ and $SL_4$ have a configuration in which one signal line is disposed in each of the four directions. In FIG. 47, the signal line $SL_1$ is disposed in an upper part, the signal line $SL_2$ is disposed in a left part, the signal line $SL_3$ is disposed in a lower part, and the signal line $SL_4$ is disposed in a right part. An input/output unit $82_i$ is connected to each signal $SL_i$ (i=1, . . . 4). A connection node $84_i$ is connected to each input/output unit $82_i$ (i=1, 4). The path transistor circuit $70_1$ is connected at one of its first and second input/output terminals to the connection node $84_1$ and connected at the other of its first and second input/output terminals to the connection node $84_2$. The path transistor circuit $70_2$ is connected at one of its first and second input/output terminals to the connection node $84_1$ and connected at the other of its first and second input/output terminals to the connection node $84_3$. The path transistor circuit $70_3$ is connected at one of its first and second input/output terminals to the connection node $84_1$ and connected at the other of its first and second input/output terminals to the connection node $84_4$. The path transistor circuit $70_4$ is connected at one of its first and second input/output terminals to the connection node $84_2$ and connected at the other of its first and second input/output terminals to the connection node $84_3$. The path transistor circuit $70_5$ is connected at one of its first and second input/output terminals to the connection node $84_2$ and connected at the other of its first and second input/output terminals to the connection node $84_4$. The path transistor circuit $70_6$ is connected at one of its first and second input/output terminals to the connection node $84_3$ and connected at the other of its first and second input/output terminals to the connection node $84_4$. Therefore, one arbitrary signal line can be connected to another arbitrary signal line through an input/output unit, a connection node, a path transistor circuit, a connection node, and an input/output unit. For example, the signal line $SL_1$ is connected to the signal line $SL_2$ through a route formed of the input/output unit $82_1$, the connection node $84_1$, the path transistor circuit $70_1$, the connection node $84_2$, and the input/output unit $82_2$.

Figure 48:
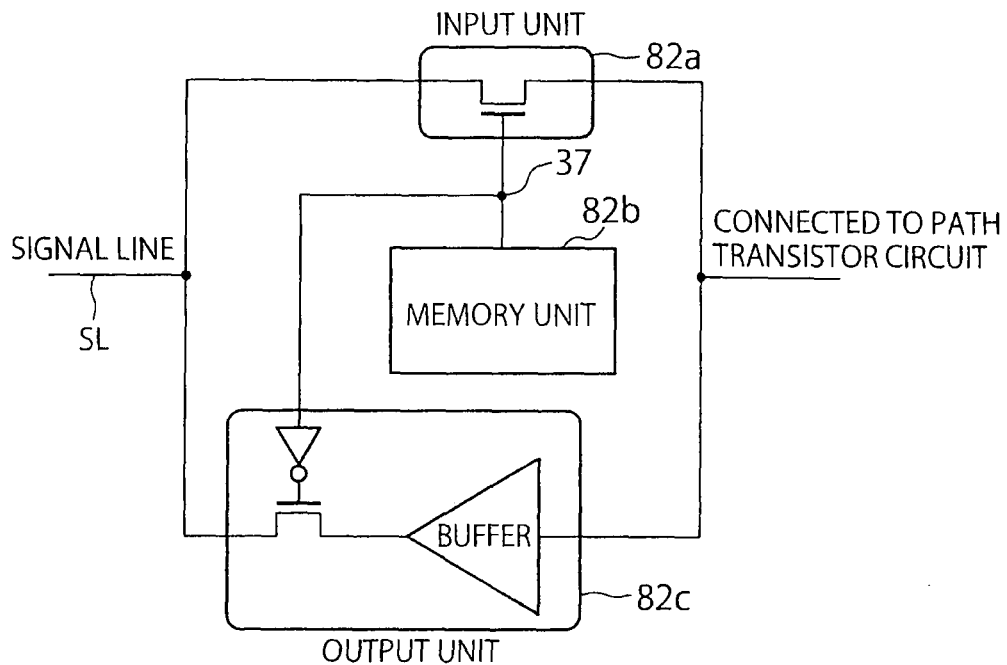
FIG. 48 is a block diagram showing a concrete example of an input/output circuit for the switching box circuit according to the sixth embodiment.

A concrete example of the input/output unit 82 in the switching box circuit 80 is shown in FIG. 48. The input/output unit 82 in this concrete example includes an input unit 82a, a memory unit 82b, and an output unit 82c. The memory unit 82b is one of memory circuits according to the first to fourth embodiments and their modifications, and the memory unit 82b has the output terminal 37 as shown in FIG. 48. The output terminal 37 is the same as the terminal 37 of one of memory circuits according to the first to fourth embodiments and their modifications. The output terminal 37 is electrically connected to only either the input unit 82a or the output unit 82c.

If the path transistor circuit 70 is used in the switching box circuit 80, the first input/output terminal 76 is connected to one signal line in one certain direction among the four directions via an input/output unit, and the second input/output terminal 78 is connected to one signal line in another direction via another input/output unit. Connection and disconnection between signal lines depend upon the on-state or the off-state of the path transistor.

(Seventh Embodiment)

Figure 49:
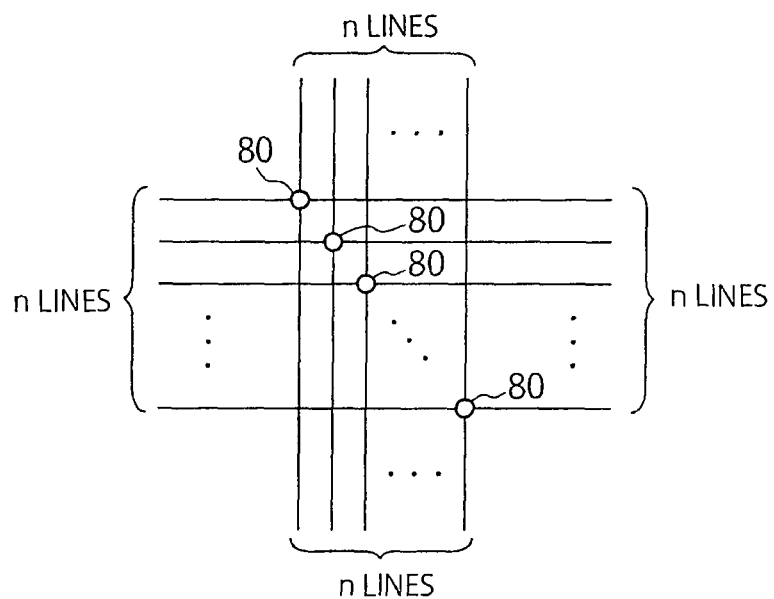
FIG. 49 is a circuit diagram showing a switching block circuit according to a seventh embodiment.

A switching block circuit 90 according to a seventh embodiment is shown in FIG. 49. The switching block circuit 90 according to the seventh embodiment includes a plurality of switching box circuits 80 according to the sixth embodiment. The switching block circuit 90 has a configuration in which n signal lines (where n≥1) are disposed in each of longitudinal and lateral directions and the switching box circuit 80 shown in, for example, FIG. 47 is provided at each of intersections of signal lines in the longitudinal direction and signal lines in the lateral direction. The switching block circuit 90 having such a configuration has a high speed and low power consumption.

(Eighth Embodiment)

Figure 50:
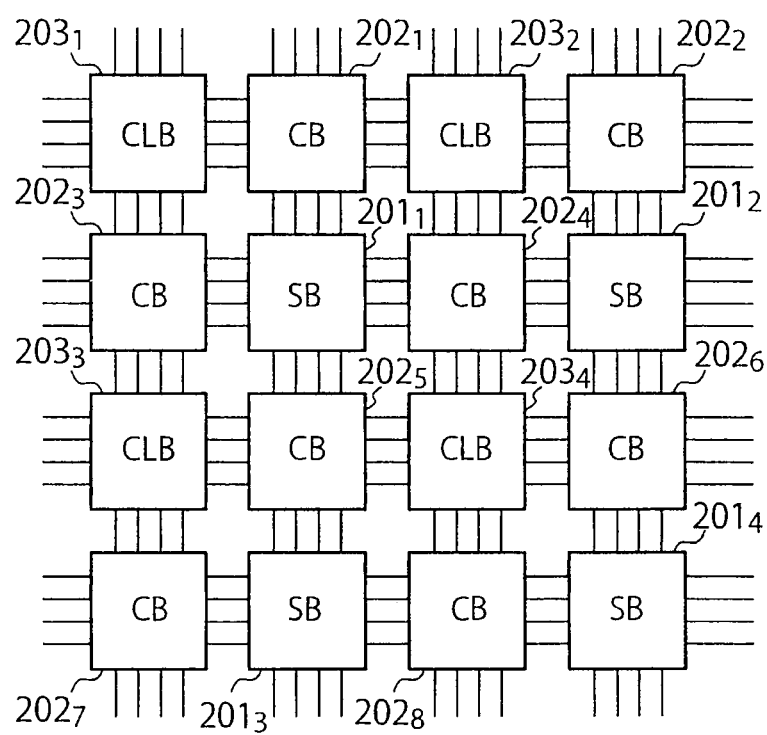
FIG. 50 is a circuit diagram showing a field programmable gate array according to an eighth embodiment.

A field programmable gate array (FPGA) according to an eighth embodiment is shown in FIG. 50. An FPGA 200 according to the eighth embodiment includes a plurality of switching blocks (SBs) $201_1$ to $201_4$, a plurality of connection boxes (CBs) $202_1$ to $202_8$, and a plurality of cluster logic blocks (CLBs) $203_1$ to $203_4$. In the FGPA according to the eighth embodiment, each of the SBs $201_1$ to $201_4$ has the same configuration as that of the switching block circuit 90 according to the seventh embodiment. The FPGA according to the eighth embodiment has a configuration in which one CB is provided on each of upper, lower, left and right sides of one CLB and an SB is provided between adjacent CBs. For example, the CB $202_1$, the CB $202_3$, the CB $202_4$ and the CB $202_5$ are provided on upper, lower, left and right sides of the SB $201_1$, and, for example, the SB $201_3$ is provided between the CB $202_7$ and the CB $202_8$ which are adjacent to each other. These SBs $201_1$ to $201_4$, CBs $202_1$ to $202_8$, and CLBs $203_1$ to $203_4$ are connected by a plurality of interconnections. In FIG. 50, a plurality of interconnections are represented by one line. The SBs and CBs determine connections and the CLBs perform logical operations.

In the eighth embodiment, the switching block circuit 90 according to the seventh embodiment is used. As a result, an FPGA which has a high speed and low power consumption is obtained.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A memory circuit comprising:
a first transistor which is a spin MOSFET of a first conductivity type, the first transistor including a first source/drain electrode, a second source/drain electrode, and a first gate electrode;
a second transistor which is either a spin MOSFET of the first conductivity type or a MOSFET of the first conductivity type, the second transistor including a third source/drain electrode connected to the second source/drain electrode of the first transistor, a fourth source/drain electrode, and a second gate electrode;
a third transistor and a fourth transistor forming an inverter circuit, the third transistor which is either a p-channel spin MOSFET or a p-channel MOSFET, the third transistor including a fifth source/drain electrode, a sixth source/drain electrode, and a third gate electrode connected to the second source/drain electrode of the first transistor, the fourth transistor which is either an n-channel spin MOSFET or an n-channel MOSFET, the fourth transistor including a seventh source/drain electrode connected to the sixth source/drain electrode of the third transistor, an eighth source/drain electrode, and a fourth gate electrode connected to the second source/drain electrode of the first transistor, and at least one of the third transistor and the fourth transistor in the inverter circuit being a spin MOSFET; and
an output terminal connected to the sixth source/drain electrode of the third transistor, an output of the inverter circuit being sent from the output terminal.

2. The circuit according to claim 1, wherein
the first and the second transistors are n-channel spin MOSFETs, the third transistor is a p-channel MOSFET, and the fourth transistor is an n-channel spin MOSFET,
both the first and the fourth transistors are in a high resistance state or in a low resistance state, and one of the first and the second transistors is in a high resistance state whereas the other of the first and the second transistors is in a low resistance state, and
at time of reading, the fifth source/drain electrode of the third transistor is connected to a power supply voltage Vdd, the second gate electrode and the fourth source/drain electrode of the second transistor as well as the eighth source/drain electrode of the fourth transistor are connected to a reference voltage GND, and the first gate electrode and the first source/drain electrode of the first transistor are connected to a voltage Vop which is at least half of the power supply voltage, i.e. Vdd/2.

3. The circuit according to claim 1, wherein
the first and the second transistors are n-channel spin MOSFETs, the third transistor is a p-channel spin MOSFET, and the fourth transistor is an n-channel spin MOSFET,
both the first and the fourth transistors are in a high resistance state or in a low resistance state, one of the first and the second transistors is in a high resistance state whereas the other of the first and the second transistors is in a low resistance state, and one of the third and the fourth transistors is in a high resistance state whereas the other of the third and the fourth transistors is in a low resistance state, and
at time of reading, the fifth source/drain electrode of the third transistor is connected to a power supply voltage Vdd, the second gate electrode and the fourth source/drain electrode of the second transistor as well as the eighth source/drain electrode of the fourth transistor are connected to a reference voltage GND, and the first gate electrode and the first source/drain electrode of the first transistor are connected to a voltage Vop which is at least half of the power supply voltage, i.e. Vdd/2.

4. The circuit according to claim 1, wherein
the first and fourth transistors are n-channel spin MOSFETs, the second transistor is an n-channel MOSFET, and the third transistor is a p-channel MOSFET,
both the first and the fourth transistors are in a high resistance state or in a low resistance state, and
at time of reading, the fifth source/drain electrode of the third transistor is connected to a power supply voltage Vdd, the second gate electrode and the fourth source/drain electrode of the second transistor as well as the eighth source/drain electrode of the fourth transistor are connected to a reference voltage GND, and the first gate electrode and the first source/drain electrode of the first transistor are connected to a voltage Vop which is at least half of the power supply voltage, i.e. Vdd/2.

5. The circuit according to claim 1, wherein
the first transistor is an n-channel spin MOSFET, the second transistor is an n-channel MOSFET, the third transistor is a p-channel spin MOSFET, and the fourth transistor is an n-channel spin MOSFET,
both the first and the fourth transistors are in a high resistance state or in a low resistance state, and one of the third and the fourth transistors is in a high resistance state whereas the other of the third and the fourth transistors is in a low resistance state, and
at time of reading, the fifth source/drain electrode of the third transistor is connected to a power supply voltage Vdd, the second gate electrode and the fourth source/drain electrode of the second transistor as well as the eighth source/drain electrode of the fourth transistor are connected to a reference voltage GND, and the first gate electrode and the first source/drain electrode of the first transistor are connected to a voltage Vop which is at least half of the power supply voltage, i.e. Vdd/2.

6. The circuit according to claim 1, wherein
the first and the second transistors are p-channel spin MOSFETs, the third transistor is a p-channel spin MOSFET, and the fourth transistor is an n-channel MOSFET,
both the first and the third transistors are in a high resistance state or in a low resistance state, and one of the first and the second transistors is in a high resistance state whereas the other of the first and the second transistors is in a low resistance state, and
at time of reading, the second gate electrode and the fourth source/drain electrode of the second transistor as well as the fifth source/drain electrode of the third transistor are connected to a power supply voltage Vdd, the eighth source/drain electrode of the fourth transistor is connected to a reference voltage GND, and the first gate electrode and the first source/drain electrode of the first transistor are connected to a voltage Vop which is at least half of the power supply voltage, i.e. Vdd/2.

7. The circuit according to claim 1, wherein
the first and the second transistors are p-channel spin MOSFETs, the third transistor is a p-channel spin MOSFET, and the fourth transistor is an n-channel spin MOSFET,
both the first and the third transistors are in a high resistance state or in a low resistance state, one of the first and the second transistors is in a high resistance state whereas the other of the first and the second transistors is in a low resistance state, and one of the third and the fourth transistors is in a high resistance state whereas the other of the third and the fourth transistors is in a low resistance state, and
at time of reading, the second gate electrode and the fourth source/drain electrode of the second transistor as well as the fifth source/drain electrode of the third transistor are connected to a power supply voltage Vdd, the eighth source/drain electrode of the fourth transistor is connected to a reference voltage GND, and the first gate electrode and the first source/drain electrode of the first transistor are connected to a voltage Vop which is at least half of the power supply voltage, i.e. Vdd/2.

8. The circuit according to claim 1, wherein
the first transistor is a p-channel spin MOSFET, the second transistor is a p-channel MOSFET, the third transistor is a p-channel spin MOSFET, and the fourth transistor is an n-channel MOSFET,
both the first and the third transistors are in a high resistance state or in a low resistance state, and
at time of reading, the second gate electrode and the fourth source/drain electrode of the second transistor as well as the fifth source/drain electrode of the third transistor are connected to a power supply voltage Vdd, the eighth source/drain electrode of the fourth transistor is connected to a reference voltage GND, and the first gate electrode and the first source/drain electrode of the first transistor are connected to a voltage Vop which is at least half of the power supply voltage, i.e. Vdd/2.

9. The circuit according to claim 1, wherein
the first transistor is a p-channel spin MOSFET, the second transistor is a p-channel MOSFET, the third transistor is a p-channel spin MOSFET, and the fourth transistor is an n-channel spin MOSFET,
both the first and the third transistors are in a high resistance state or in a low resistance state, and one of the third and the fourth transistors is in a high resistance state whereas the other of the third and the fourth transistors is in a low resistance state, and
at time of reading, the second gate electrode and the fourth source/drain electrode of the second transistor and the fifth source/drain electrode of the third transistor are connected to a power supply voltage Vdd, the eighth source/drain electrode of the fourth transistor is connected to a reference voltage GND, and the first gate electrode and the first source/drain electrode of the first transistor are connected to a voltage Vop which is at least half of the power supply voltage, i.e. Vdd/2.

10. The circuit according to claim 1, further comprising a fifth transistor which is either an n-channel MOSFET or a p-channel MOSFET, having a ninth electrode which is connected to the sixth source/drain electrode of the third transistor and which is one of a source/drain electrode, a tenth electrode which is the other of the source/drain electrode, and a gate electrode.

11. A path transistor circuit with memory function comprising the memory circuit according to claim 1 and a path transistor including a gate, the gate being connected to the output terminal of the memory circuit.

12. A switching box circuit comprising a plurality of path transistor circuits according to claim 11.

13. A switching block circuit comprising a plurality of switching box circuits according to claim 12.

14. A field programmable gate array comprising a plurality of switching block circuits according to claim 13, a plurality of connection boxes, and a plurality of cluster logic blocks.

* * * * *